United States Patent
Hwang et al.

(10) Patent No.: US 10,938,383 B2
(45) Date of Patent: Mar. 2, 2021

(54) SEQUENTIAL CIRCUIT HAVING INCREASED NEGATIVE SETUP TIME

(71) Applicant: SAMSUNG ELECTRONICS CO., LTD., Suwon-si (KR)

(72) Inventors: Hyun-Chul Hwang, Suwon-si (KR); Jong-Kyu Ryu, Seoul (KR); Min-Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 15/906,693

(22) Filed: Feb. 27, 2018

(65) Prior Publication Data
US 2019/0074825 A1 Mar. 7, 2019

(30) Foreign Application Priority Data
Sep. 6, 2017 (KR) ........................ 10-2017-0114032

(51) Int. Cl.
*H03K 5/135* (2006.01)
*H03K 3/356* (2006.01)
(Continued)

(52) U.S. Cl.
CPC ............. *H03K 5/135* (2013.01); *H03K 3/012* (2013.01); *H03K 3/037* (2013.01);
(Continued)

(58) Field of Classification Search
CPC .. H03K 3/012; H03K 3/037; H03K 3/356104; H03K 3/356121; H03K 5/135; H03K 2005/00013
See application file for complete search history.

(56) References Cited

U.S. PATENT DOCUMENTS

| 6,448,831 B1 | 9/2002 | Hunt, Jr. et al. |
| 6,466,049 B1 | 10/2002 | Diba et al. |

(Continued)

FOREIGN PATENT DOCUMENTS

| CN | 1741381 A | 3/2006 |
| JP | 2000236062 A | 8/2000 |

OTHER PUBLICATIONS

Heo, et al., "Load-Sensitive Flip-Flop Characterization", Apr. 2001, IEEE Workshop on VLSI, 6 pages total.

(Continued)

*Primary Examiner* — Patrick O Neill
(74) *Attorney, Agent, or Firm* — Sughrue Mion, PLLC

(57) ABSTRACT

A sequential circuit includes a first gate circuit, a second gate circuit and an output circuit. The first circuit generates a first signal based on an input signal, an input clock signal and a second signal. The second circuit generates an internal clock signal by performing a NOR operation on the first signal and an inversion clock signal which is inverted from the input clock signal, and generates the second signal based on the internal clock signal and the input signal. The output circuit generates an output signal based on the second signal. Operation speed of the sequential circuit and the integrated circuit including the same may be increased by increasing the negative setup time reflecting a transition of the input signal after a transition of the input clock signal, through mutual controls between the first circuit and the second circuit.

10 Claims, 46 Drawing Sheets

(51) Int. Cl.
    *H03K 3/037* (2006.01)
    *H03K 3/012* (2006.01)
    *H03K 5/00* (2006.01)
    *H03K 19/20* (2006.01)
    *H03K 19/21* (2006.01)

(52) U.S. Cl.
    CPC . *H03K 3/356104* (2013.01); *H03K 3/356121* (2013.01); *H03K 19/20* (2013.01); *H03K 19/21* (2013.01); *H03K 2005/00013* (2013.01)

(56) References Cited

U.S. PATENT DOCUMENTS

| | | | |
|---|---|---|---|
| 6,956,405 B2 * | 10/2005 | Lundberg | G06F 9/3869 326/46 |
| 7,138,829 B1 | 11/2006 | Dalvi | |
| 7,345,519 B2 | 3/2008 | Hirata | |
| 8,656,238 B2 | 2/2014 | Lee et al. | |
| 9,059,693 B2 | 6/2015 | Singh et al. | |
| 9,160,317 B2 * | 10/2015 | Singh | H03K 3/356121 |
| 9,722,611 B2 * | 8/2017 | Hwang | H03K 3/356121 |
| 10,033,386 B2 * | 7/2018 | Hwang | H03K 19/01852 |
| 2001/0052096 A1 | 12/2001 | Huijbregts | |
| 2004/0032290 A1 | 2/2004 | Lundberg | |
| 2008/0116953 A1 | 5/2008 | Hirata et al. | |
| 2016/0373112 A1 | 12/2016 | Hwang et al. | |
| 2017/0070214 A1 | 3/2017 | Kim et al. | |
| 2017/0070215 A1 | 3/2017 | Hwang et al. | |

OTHER PUBLICATIONS

Anonymous, "Overview and Dynamics of Scan Chain Testing", May 2014, Anysilicon, 4 pages total.

Communication dated Jan. 16, 2019, issued by the Intellectual Property Office of Singapore in counterpart Singaporean Patent Application No. 10201805776P.

Communication dated Aug. 28, 2020 issued by the Intellectual Property India Patent Office in Indian Application No. 201824032787.

* cited by examiner

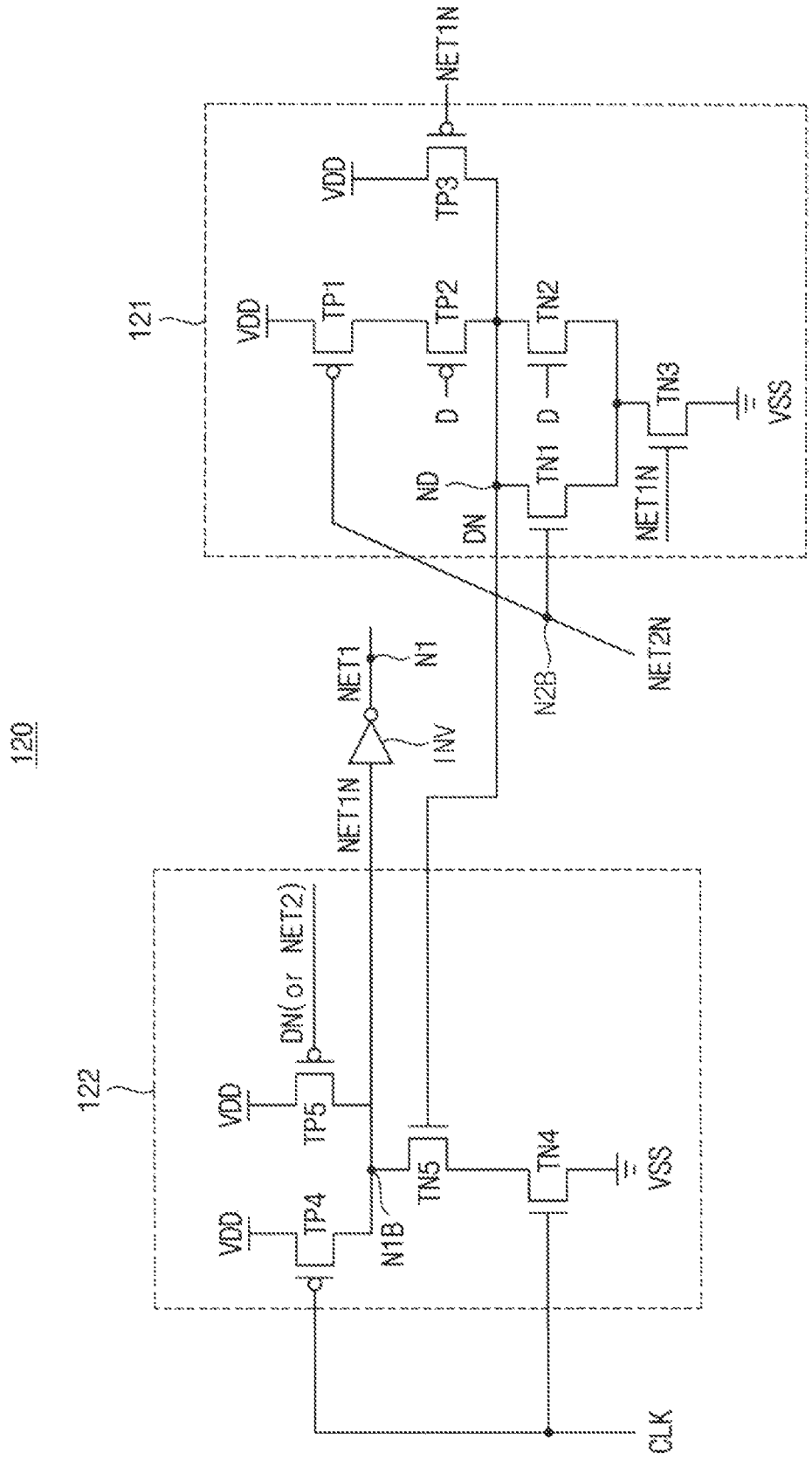

FIG. 18B
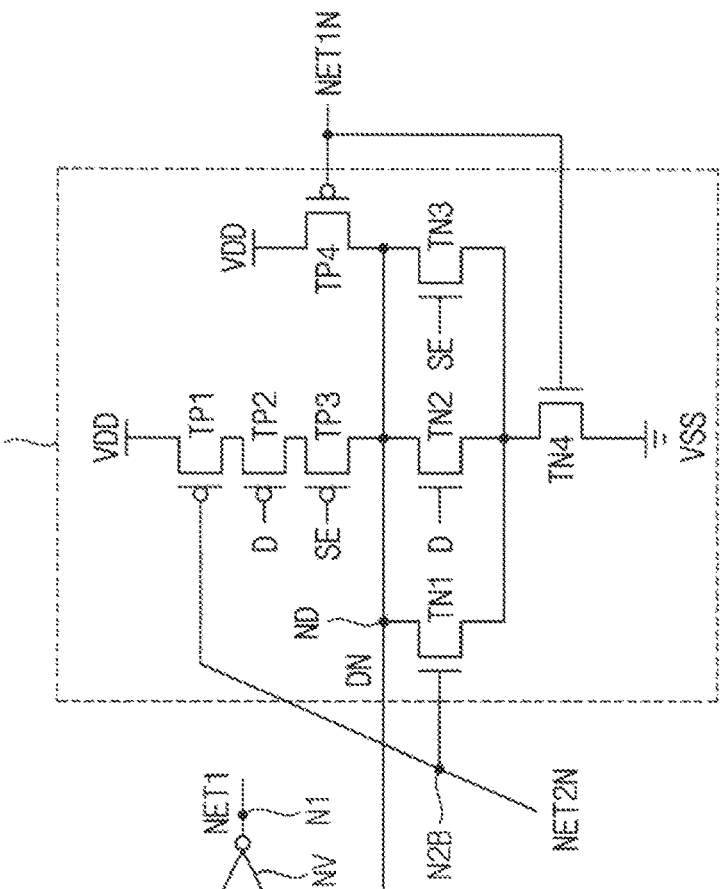
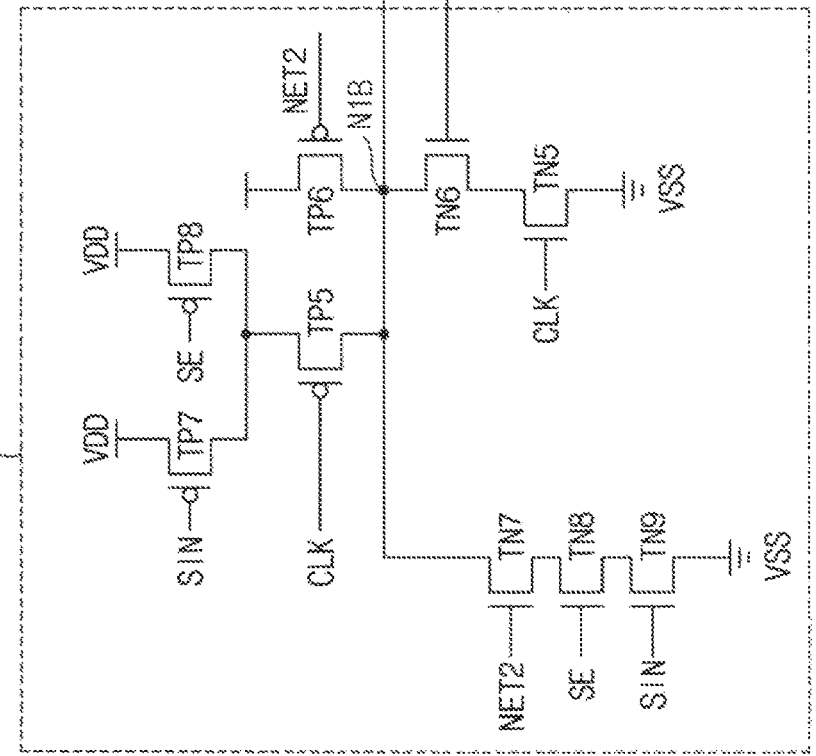

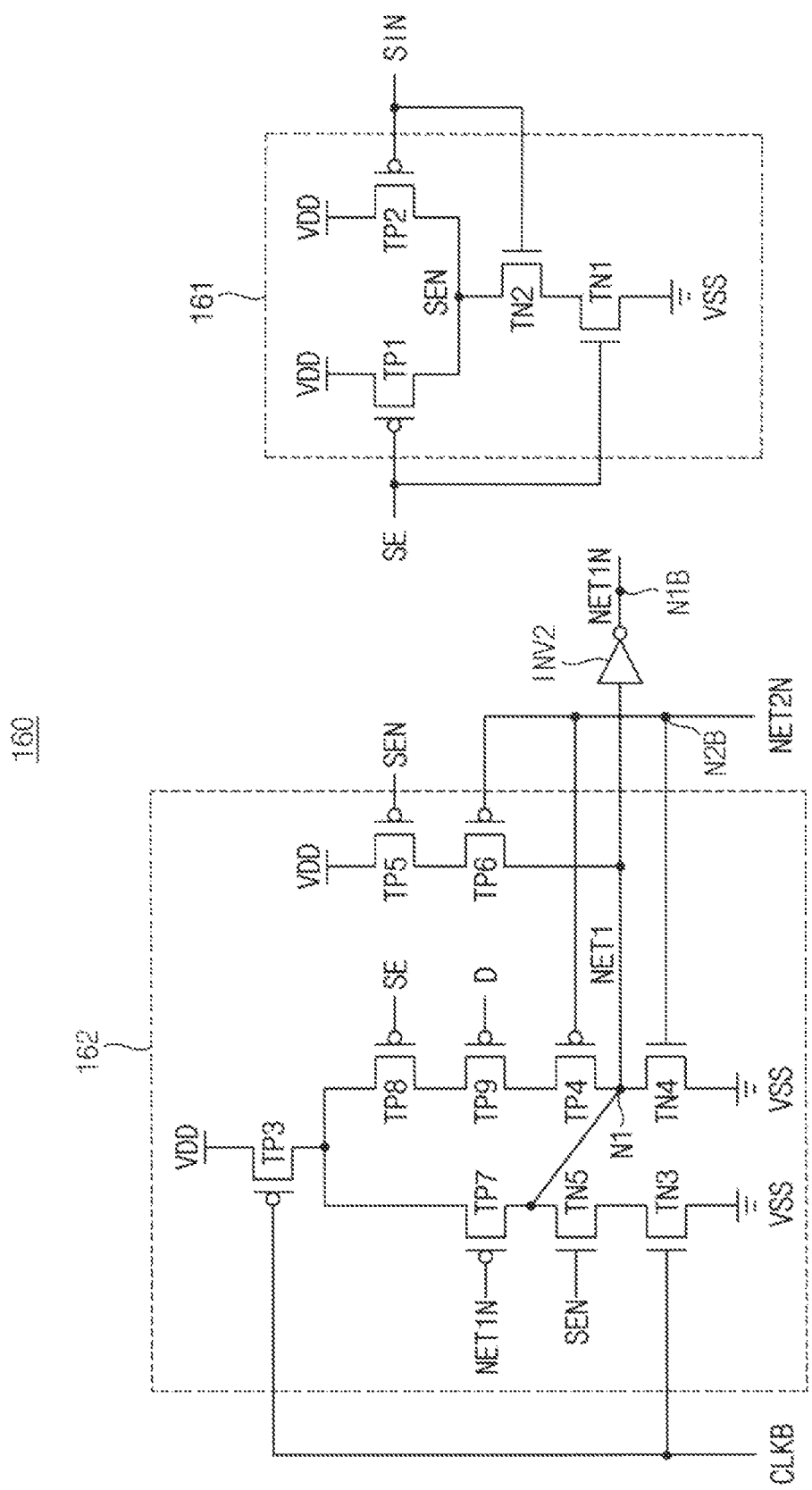

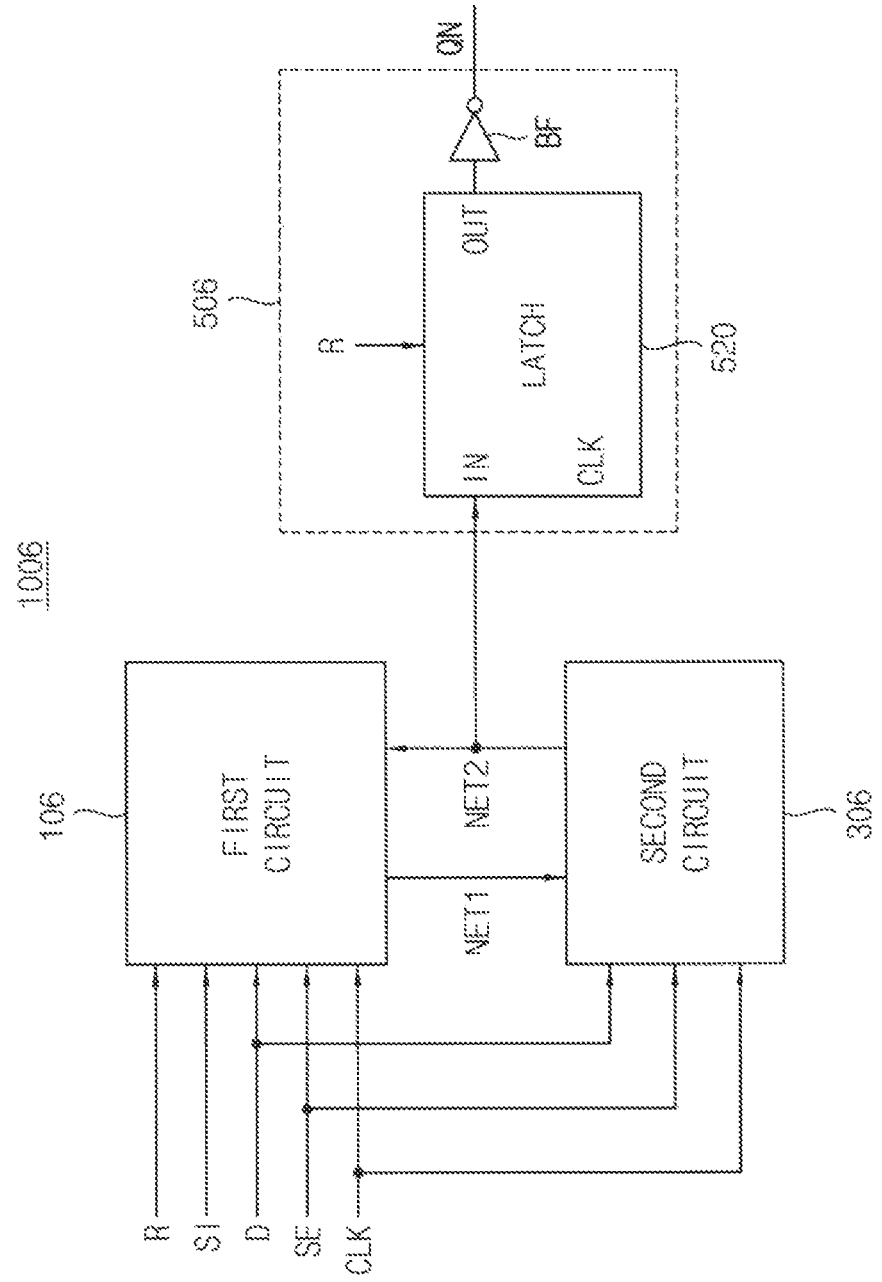

SEQUENTIAL CIRCUIT HAVING INCREASED NEGATIVE SETUP TIME

CROSS-REFERENCE TO THE RELATED APPLICATION

This application claims priority under 35 USC § 119 to Korean Patent Application No. 10-2017-0114032, filed on Sep. 6, 2017, in the Korean Intellectual Property Office, the disclosure of which is incorporated by reference in its entirety herein.

BACKGROUND

1. Field

Apparatuses consistent with example embodiments of the inventive concept relate generally to semiconductor integrated circuits, and more particularly, to a sequential circuit having an increased negative setup time.

2. Discussion of the Related Art

Sequential circuits include flip-flops, integrated clock gating circuits, etc., which are used widely in semiconductor integrated circuits. Development of a high-speed sequential circuit is required because an operation speed of the sequential circuit directly effects on an operation speed of the semiconductor integrated circuit.

SUMMARY

Some example embodiments may provide a sequential circuit having a high operation speed.

Some example embodiments may provide a sequential circuit having an efficient scan test function in addition to a high operation speed.

According to example embodiments, there is provided a sequential circuit which may include a first gate circuit, a second gate circuit and an output circuit. The first circuit generates a first signal based on an input signal, an input clock signal and a second signal. The second circuit generates an internal clock signal by performing a NOR operation on the first signal and an inversion clock signal which is inverted from the input clock signal, and generates the second signal based on the internal clock signal and the input signal. The output circuit generates an output signal based on the second signal.

According to example embodiments, there is provided a sequential circuit which may include a first gate circuit, a second gate circuit and an output circuit. The first circuit generates a first signal based on a scan input signal, an input data signal, a scan enable signal, an input clock signal and a second signal. The second circuit generates an internal clock signal by performing a NOR operation on the first signal and an inversion clock signal which is inverted from the input clock signal, and generates the second signal based on the internal clock signal, the input data signal and the scan enable signal. The output circuit generates an output signal based on the second signal.

According to example embodiments, there is provided a sequential circuit which may include a first gate circuit, a second gate circuit and an output circuit. The first circuit generates a first signal based on a clock enable signal, an input clock signal and a second signal. The second circuit generates an internal clock signal by performing a NOR operation on the first signal and an inversion clock signal that is inverted from the input clock signal, and generates the second signal based on the internal clock signal and the clock enable signal. The buffer generates an output clock signal by buffering the second signal.

The sequential circuit according to example embodiments may have the increased negative setup time reflecting a transition of the input signal after a transition of the input clock signal, through mutual controls between the first circuit and the second circuit, and thus, operation speed of the sequential circuit and the integrated circuit including the same may be increased.

The sequential circuit according to example embodiments may include only a single stage of a gate circuit on a data transfer path in the second circuit to reduce a data output delay, and thus, operation speed of the sequential circuit and the integrated circuit may be increased.

The sequential circuit according to example embodiments may set the delay time of the scan test path longer than the delay time of the normal path, and thus, the scan test may be supported efficiently.

BRIEF DESCRIPTION OF THE DRAWINGS

Example embodiments of the inventive concept will be more clearly understood from the following detailed description taken in conjunction with the accompanying drawings.

FIG. 10B is a circuit diagram illustrating an example embodiment of the first circuit of FIG. 10A.

FIG. 18B is a circuit diagram illustrating an example embodiment of the first circuit of FIG. 18A.

FIG. 19B is a circuit diagram illustrating an example embodiment of the first circuit of FIG. 19A.

FIG. 25 is a block diagram illustrating a sequential circuit according to example embodiments.

DETAILED DESCRIPTION OF THE EXAMPLE EMBODIMENTS

Figure 1:
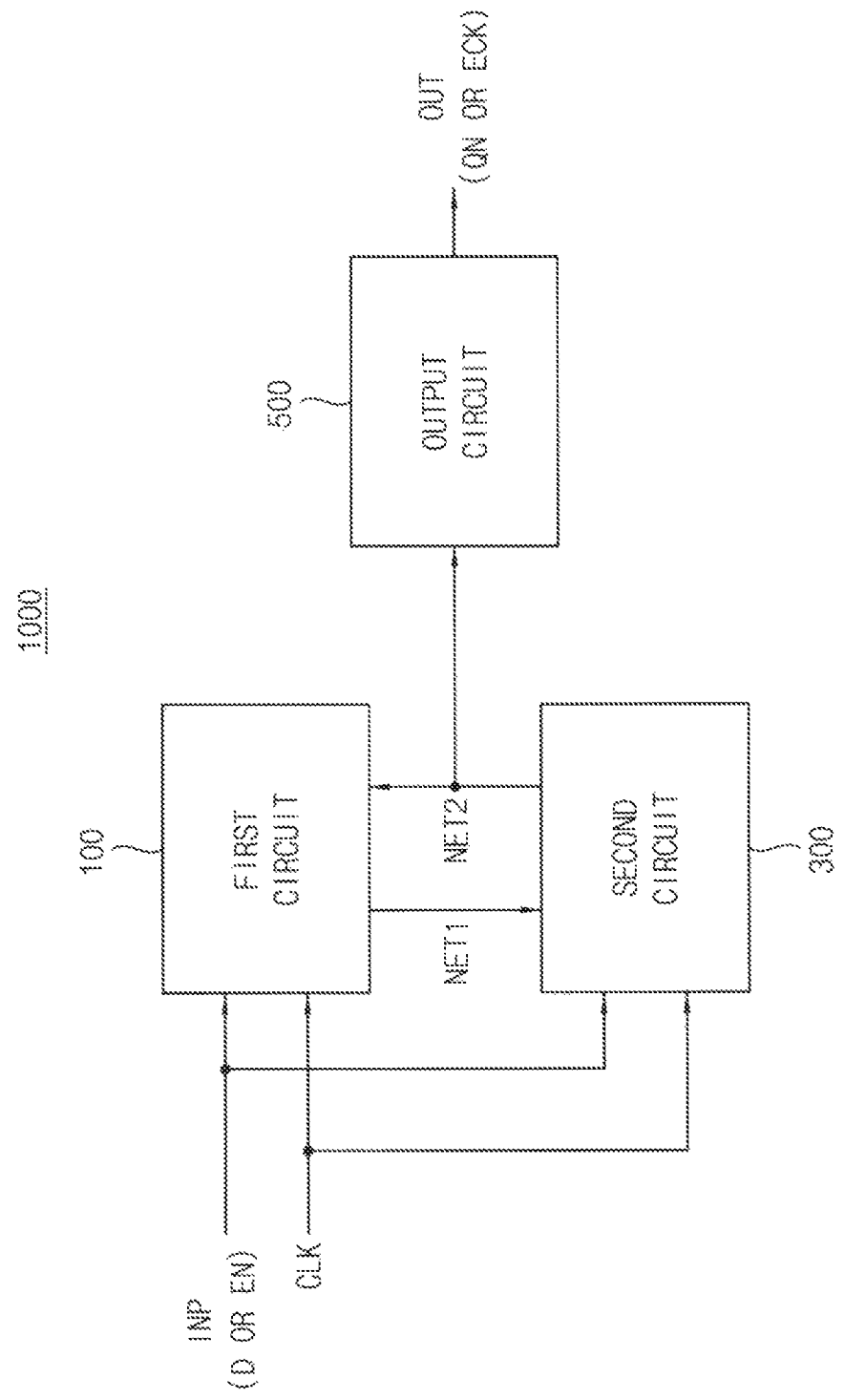
FIG. 1 is a block diagram illustrating a sequential circuit according to example embodiments.

Various aspects of the inventive concept will be described more fully hereinafter with reference to the accompanying drawings, in which some example embodiments are shown. In the drawings, like numerals refer to like elements throughout. The repeated descriptions may be omitted.

FIG. 1 is a block diagram illustrating a sequential circuit according to example embodiments.

Referring to FIG. 1, a sequential circuit 1000 includes a first circuit 100, a second circuit 300 and an output circuit 500.

The first circuit 100 generates a first signal NET1 based on an input signal INP, an input clock signal CLK and a second signal NET2. As will be described with referent to FIG. 3A, the second circuit 300 generates an internal clock signal CLKD by performing a NOR operation on the first signal NET1 and an inversion clock signal CLKB which is inverted from the input clock signal CLK, and generates the second signal NET2 based on the internal clock signal CLKD and the input signal INP. The output circuit 500 generates an output signal OUT based on the second signal NET2.

The first circuit 100 and the second circuit 300 may control each other through the first signal NET1 and the second signal NET2, in a similar way to a set-reset (SR) latch. The second signal NET2 may be transferred to the output circuit 500, and the sequential circuit 1000 may function as a flip-flop or a clock gating circuit depending on a configuration of the output circuit 500.

In some example embodiments, the sequential circuit 1000 may be a flip-flop that receives, as the input signal INP, an input data signal D, and generates, as the output signal OUT, an output data signal QN corresponding to the input data signal D. When the sequential circuit 1000 is implemented by this flip-flop, the output circuit 500 may include a latch and a buffer as will be described with referent to FIGS. 6 and 7.

In other example embodiments, the sequential circuit 1000 may be a clock gating circuit that receives, as the input signal INP, a clock enable signal EN, and generates, as the output signal OUT, an output clock signal ECK that toggles in response to an activation of the clock enable signal EN. When the sequential circuit 1000 is implemented by this clock gating circuit, the output circuit 500 may include only a buffer without a latch as will be described with referent to FIG. 12.

In the sequential circuit 1000 according to example embodiments, if the input signal INP transitions before a negative setup time elapses from a time point when the input clock signal CLK transitions from a first logic level to a second logic level, one of the first signal NET1 and the second signal NET2 may transition.

Hereinafter, example embodiments are described mainly based a case that a sequential circuit samples the input signal INP at a rising edge of the input clock signal CLK. In this case, the first logic level may be a logic low level and the second logic level may be a logic high level. The inventive concept, however, may also be applied to cases that a sequential circuit samples the input signal INP at a falling edge of the input clock signal CLK. In this case, the first logic level may be the logic high level and the second logic level may be the logic low level. Those skilled in the art will be easily understood that disclosed example embodiments of the rising-edge sample may be modified to example embodiments of the falling-edge sampling through signal inversion, exchange of transistor type between an N-type and a P-type, etc.

Figure 2A:
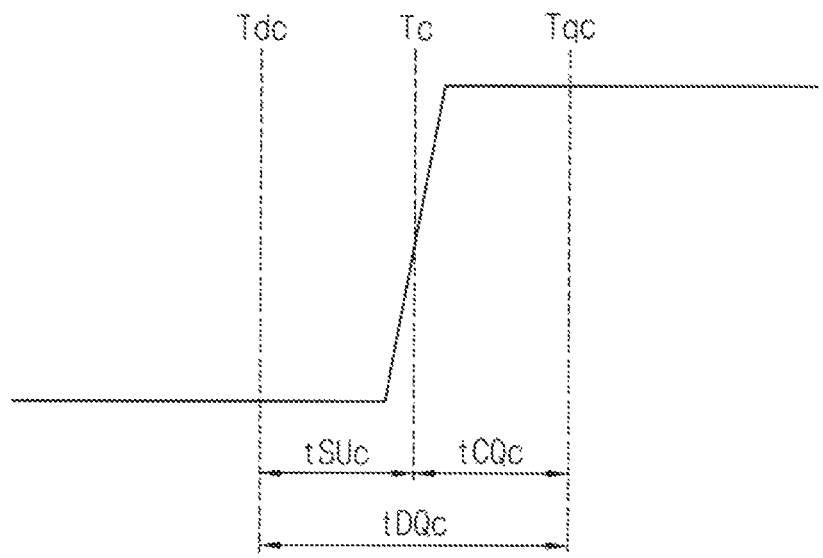
FIGS. 2A and 2B are diagrams for describing a negative setup time of a sequential circuit according to example embodiments.
Figure 2B:
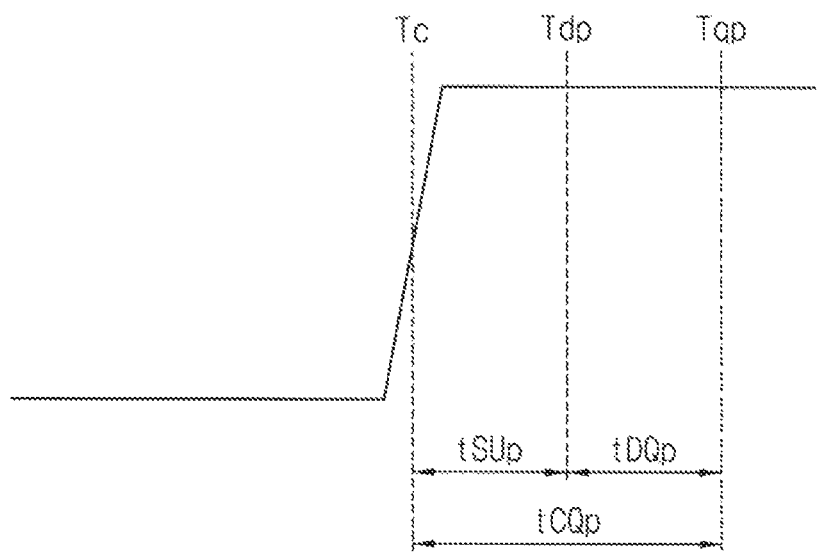

FIGS. 2A and 2B are diagrams for describing a negative setup time of a sequential circuit according to example embodiments.

FIG. 2A illustrates a setup time tSUc, a clock-to-output delay time tCQc and an input-to-output delay time tDQc of a general sequential circuit, and FIG. 2B illustrates a setup time tSUp, a clock-to-output delay time tCQp and an input-to-output delay time tDQp of a sequential circuit according to example embodiments. Tc indicates a transitioning time point of the input clock signal CLK, Tdc and Tdp indicate transitioning time points of the input signal INP, and Tqc and Tqp indicate transitioning time points of the output signal OUT.

Speed of a flip-flop is generally decided by the input-to-output delay time tDQc. The input-to-output delay time tDQc is defined by a sum of a setup time tSUc and a clock-to-output delay time tCQc. As well known, the setup time tSUc is a time needed to stably provide data, that is, the data of the input signal, to the flip-flop. In other words, the setup time tSUc indicates a time interval that the transition of the input signal has to be finished in advance prior to the sampling edge of the clock signal. The clock-to-output delay time tCQc indicates a delay time from a sampling of the clock signal to the issuance of the output data. The reduction of the input-to-output delay time tDQc is essential to design a high-speed sequential circuit.

As illustrated in FIG. 2B, the sequential circuit according to example embodiments has a negative setup time tSUp. The negative setup time represents that the sequential circuit may reflect the transition of the input signal even after the transition of the sampling clock signal. The sequential circuit according to example embodiments may have the reduced input-to-output delay time tDQ through the increased negative setup time tSUp, and thus, the operation speed of the sequential circuit and an integrated circuit including the sequential circuit may be increased.

Figure 3A:
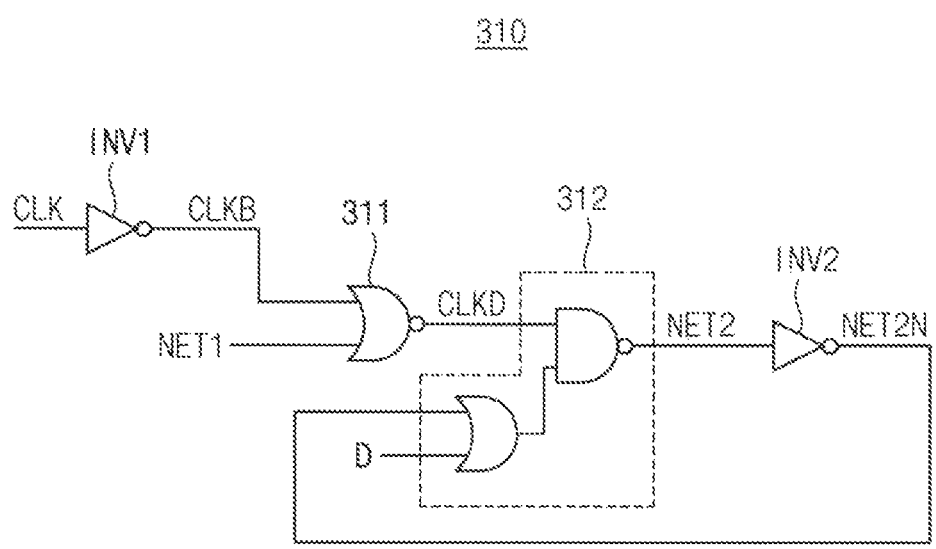
FIG. 3A is a block diagram illustrating an example embodiment of a second circuit included in the sequential circuit of FIG. 1
Figure 3B:
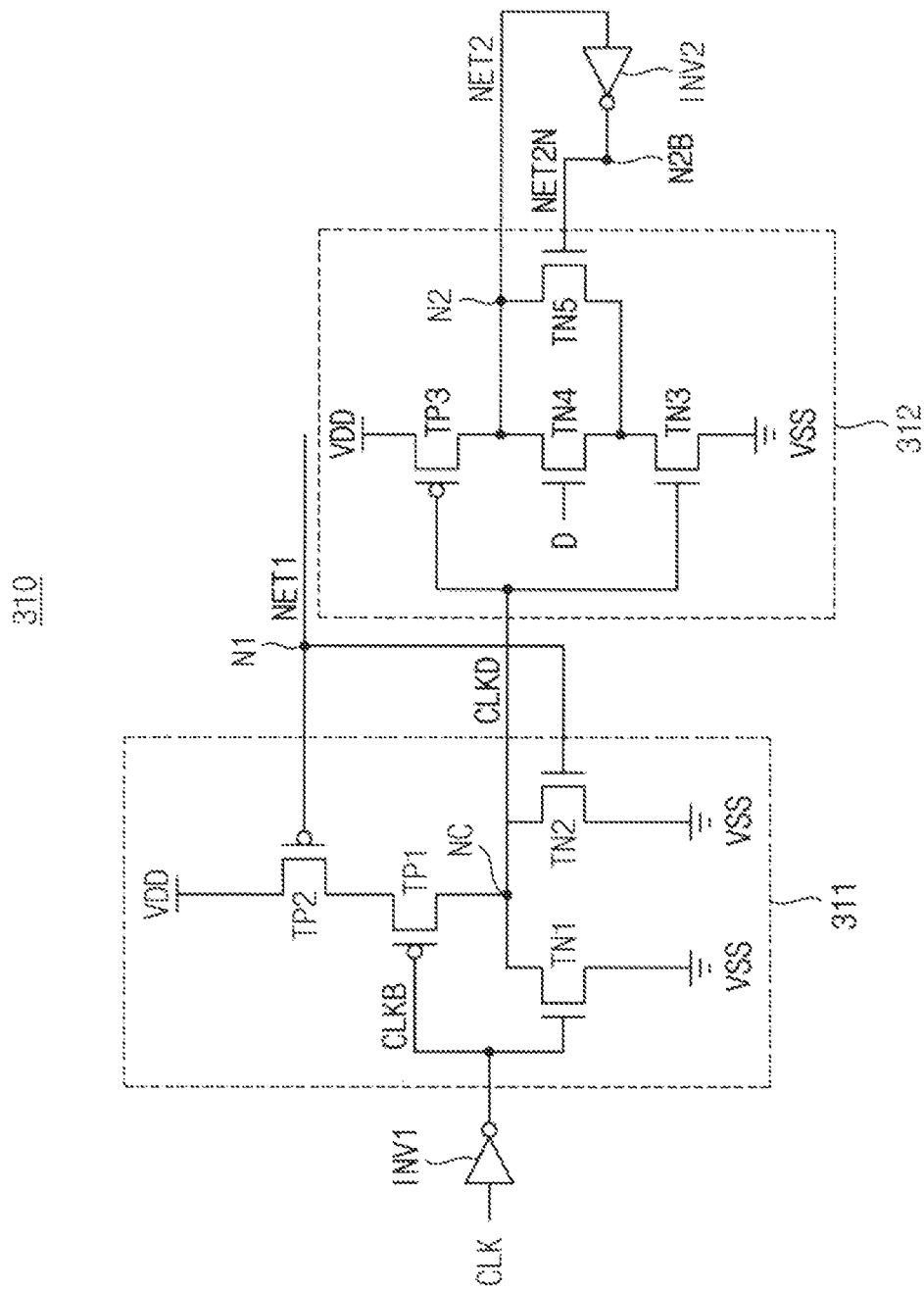
FIG. 3B is a circuit diagram illustrating an example embodiment of the second circuit of FIG. 3A.

FIG. 3A is a block diagram illustrating an example embodiment of the second circuit 300 included in the sequential circuit 1000 of FIG. 1, and FIG. 3B is a circuit diagram illustrating an example embodiment of the second circuit of FIG. 3A.

Referring to FIG. 3A, a second circuit 310 may include a first gate circuit 311, a second gate circuit 312, a first inverter INV1 and a second inverter INV2.

The first inverter INV1 inverts the input clock signal CLK to generate an inversion clock signal CLKB. The second inverter INV2 inverts the second signal NET2 to generate a second inversion signal NET2N. According to example embodiments, the first inverter INV1 may be omitted, the inversion clock signal CLKB may be provided from the external.

The first gate circuit 311 may generate an internal clock signal CLKD by performing a NOR operation on the first signal NET1 and the inversion clock signal CLKB. The first gate circuit 311 may be implemented as a NOR gate.

The second gate circuit 312 may generate the second signal NET2 by performing a NAND operation on the internal clock signal CLKD and an OR operation result of an input data signal D corresponding to the input signal INP and the second inversion signal NET2N. The second gate circuit 312 may be implemented as an OAI (OR-AND-Inverter) gate. The OAI gate is a complex logic gate that performs a plurality of logic operations simultaneously. In an aspect of a delay time, the OAI gate corresponds to a single gate.

As such, a data transfer path in the second circuit 312 includes only a single gate to reduce a data output delay, and thus, operation speed of the sequential circuit and an integrated circuit including the sequential circuit may be increased.

Referring to FIG. 3B, the first gate circuit 311 and the second gate circuit 312 of the second circuit 310 may be implemented with a plurality of transistors.

The first gate circuit 311 may include a first PMOS (p-type metal oxide semiconductor) transistor TP1, a second PMOS transistor TP2, a first NMOS (n-type metal oxide semiconductor) transistor TN1 and a second NMOS transistor TN2.

The first PMOS transistor TP1 is connected between a power supply voltage VDD and an internal clock node NC generating the internal clock signal CLKD, and receives the inversion clock signal CLKB which is inverted from the input clock signal CLK. Hereinafter, "a transistor receives a signal" may represent "a gate electrode of a transistor receives a signal" if different descriptions are not provided. The first NMOS transistor TN1 is connected between a ground voltage VSS and the internal clock node NC, and receives the inversion clock signal CLKB. The second PMOS transistor TP2 is connected in series with the first PMOS transistor TP1 between the power supply voltage VDD and the internal clock node NC, and receives the first signal NET1 from a first node N1. The second NMOS transistor TN2 is connected in parallel to the first NMOS transistor TN1 between the ground voltage VSS and the internal clock node NC.

The second gate circuit 312 may include a third PMOS transistor TP3, a third NMOS transistor TN3, a fourth NMOS transistor TN4 and a fifth NMOS transistor TN5.

The third PMOS transistor TP3 is connected between the power supply voltage VDD and a second node N2 generating the second signal NET2, and receives the internal clock signal CLKD. The third NMOS transistor TN3 is connected between the ground voltage VSS and the second node N2, and receives the internal clock signal CLKD. The fourth NMOS transistor TN4 is connected in series with the third NMOS transistor TN3 between the ground voltage VSS and the second node N2, and receives the input data signal D. The fifth NMOS transistor TN5 is connected in parallel to the fourth NMOS transistor TN4 between the ground voltage VSS and the second node N2, and receives the second inversion signal NET2N. The input node of the second inverter INV2 corresponds to the second node N2, and the output node of the second inverter INV2 corresponds to the second inversion node N2B.

Figure 4A:
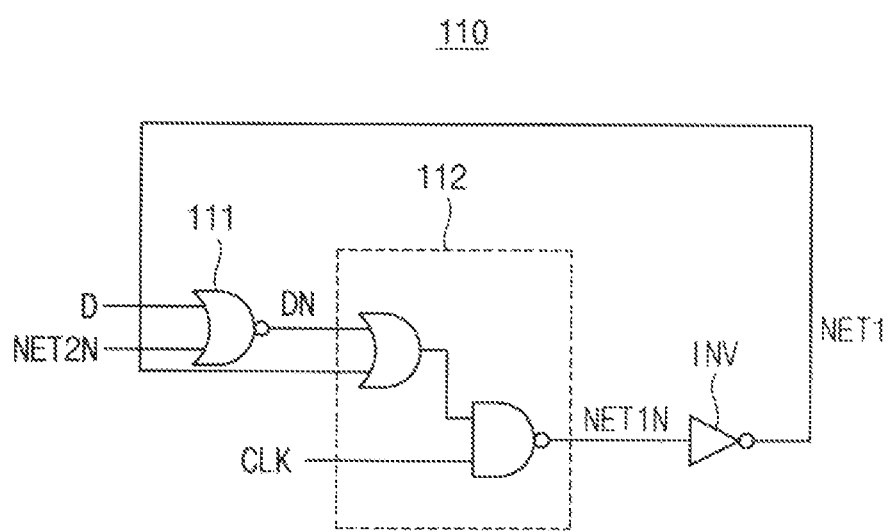
FIG. 4A is a block diagram illustrating an example embodiment of a first circuit included in the sequential circuit of FIG. 1
Figure 4B:
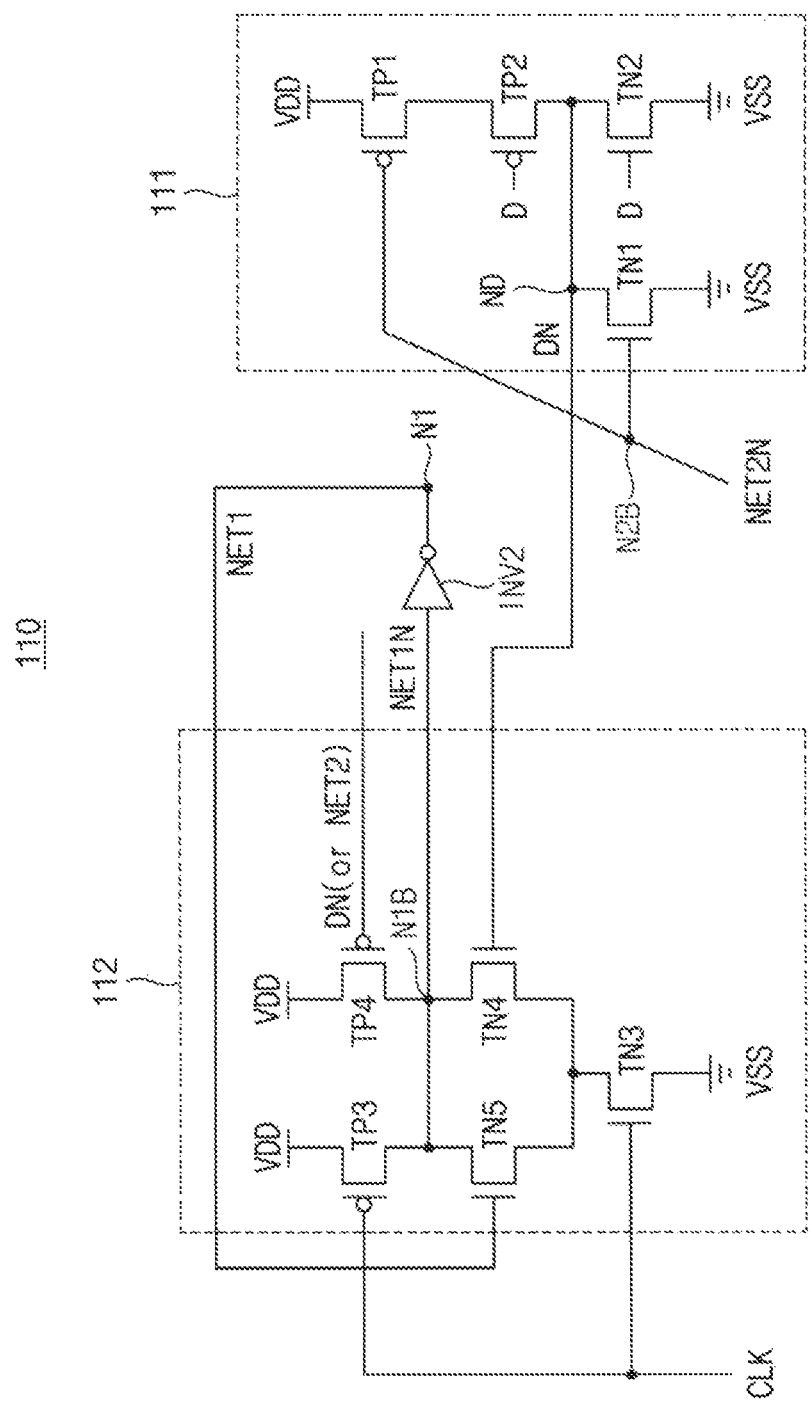
FIG. 4B is a circuit diagram illustrating an example embodiment of the first circuit of FIG. 4A.

FIG. 4A is a block diagram illustrating an example embodiment of the first circuit 100 included in the sequential circuit 1000 of FIG. 1, and FIG. 4B is a circuit diagram illustrating an example embodiment of the first circuit of FIG. 4A.

Referring to FIG. 4A, a first circuit 110 may include a first gate circuit 111, a second gate circuit 112 and an inverter INV.

The first gate circuit 111 generate an internal signal DN by performing a NOR operation on the input data signal D, corresponding to the input signal INP, and the second inversion signal NET2N which is inverted from the second signal NET2. The first gate circuit 111 may be implemented as a NOR gate.

The second gate circuit 112 may generate a first inversion signal NET1N by performing a NAND operation on the input clock signal CLK and an OR operation result of the internal signal DN and the first signal NET1. The inverter INV generates the first signal NET1 by inverting the first inversion signal NET1N. The second gate circuit 112 may be implemented as an OAI gate.

Referring to FIG. 4B, the first gate circuit 111 and the second gate circuit 112 of the first circuit 110 may be implemented with a plurality of transistors.

The first gate circuit 111 may include a first PMOS transistor TP1, a second PMOS transistor TP2, a first NMOS transistor TN1 and a second NMOS transistor TN2.

The first PMOS transistor TP1 is connected between a power supply voltage VDD and an internal data node ND generating the internal signal DN, and receives the second inversion signal NET2N from a second inversion node N2B. The first NMOS transistor TN1 is connected between a ground voltage VSS and the internal data node ND, and receives the second inversion signal NET2N. The second PMOS transistor TP2 is connected in series with the first PMOS transistor TP1 between the power supply voltage VDD and the internal data node ND, and receives the input data signal D. The second NMOS transistor TN2 is connected in parallel to the first NMOS transistor TN1 between the ground voltage VSS and the internal data node ND.

The second gate circuit 112 may include a third PMOS transistor TP3, a fourth PMOS transistor, a third NMOS transistor TN3, a fourth NMOS transistor TN4 and a fifth NMOS transistor TN5.

The third PMOS transistor TP3 is connected between the power supply voltage VDD and a first inversion node N1B generating the first inversion signal NET1N, and receives the input clock signal CLK. The third NMOS transistor TN3 is connected between the ground voltage VSS and the first inversion node N1B, and receives the input clock signal CLK. The fourth PMOS transistor is connected in parallel to the third PMOS transistor TP3 between the power supply voltage VDD and the first inversion node N1B, and receives the internal signal DN or the second inversion signal NET2N. The fourth NMOS transistor TN4 is connected in series with the third NMOS transistor TN3 between the ground voltage VSS and the first inversion node N1B, and receives the internal signal DN. The fifth NMOS transistor TN5 is connected in parallel to the fourth NMOS transistor TN4 between the ground voltage VSS and the first inversion node N1B, and receives the first signal NET1.

Figure 5:
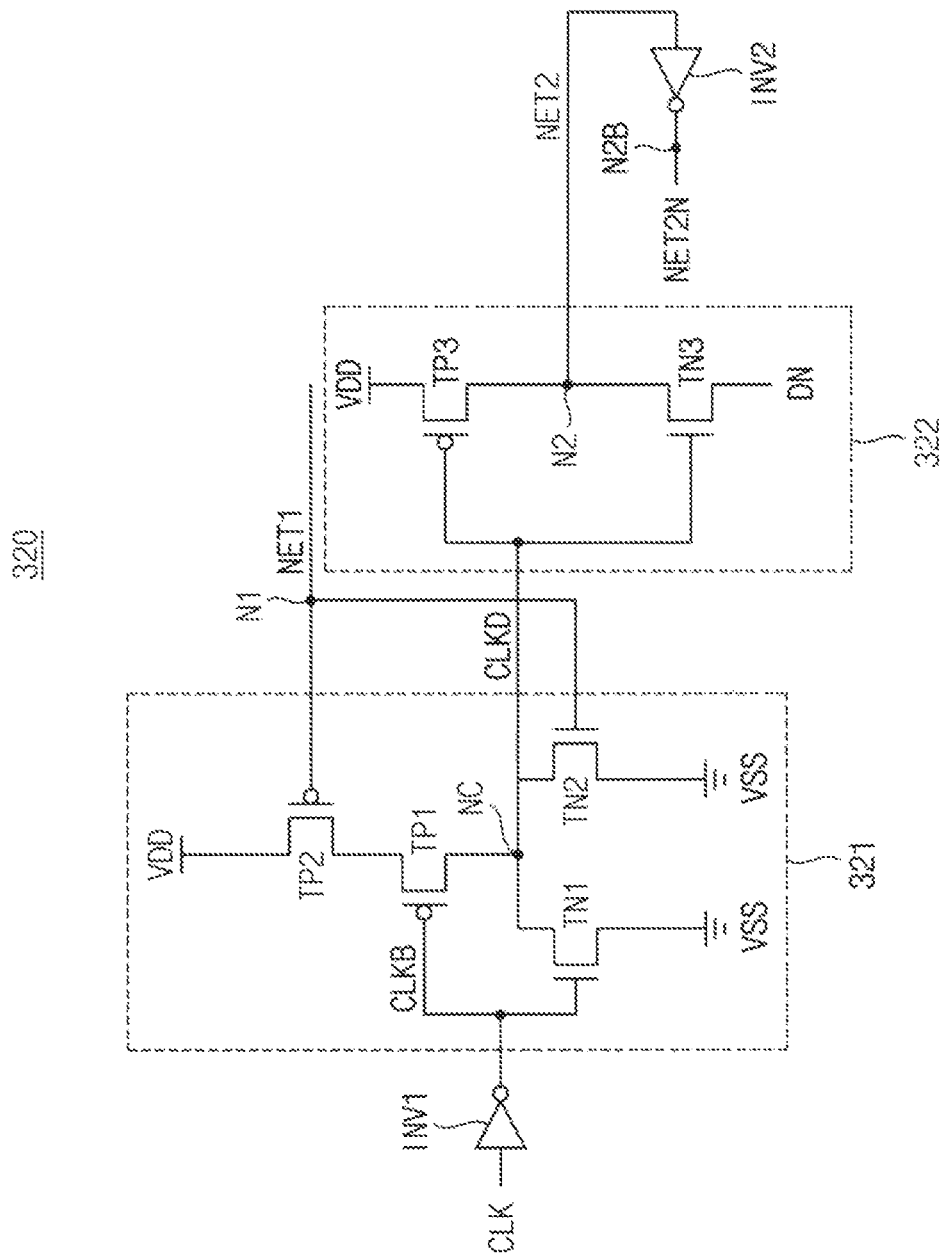
FIG. 5 is a circuit diagram illustrating an example embodiment of a second circuit included in the sequential circuit of FIG. 1.

FIG. 5 is a circuit diagram illustrating an example embodiment of the second circuit 300 included in the sequential circuit 1000 of FIG. 1.

Referring to FIG. 5, a first gate circuit 321 and a second gate circuit 322 of a second circuit 320 may be implemented with a plurality of transistors.

The first gate circuit 321 may include a first PMOS transistor TP1, a second PMOS transistor TP2, a first NMOS transistor TN1 and a second NMOS transistor TN2. The first gate circuit 321 in FIG. 5 is identical to the first gate circuit 311 in FIG. 3A and the repeated descriptions are omitted.

The second gate circuit 322 may include a third PMOS transistor TP3 and a third NMOS transistor TN3. The third PMOS transistor TP3 is connected between the power supply voltage VDD and a second node N2 generating the second signal NET2, and receives the internal clock signal CLKD. The third NMOS transistor TN3 is connected between the internal data node ND generating the internal signal DN and the second node N2, and receives the internal clock signal CLKD.

The transistors TN4 and TN5 in the second gate circuit 312 of FIG. 3A are omitted in the second gate circuit 322 of FIG. 5, and the internal signal DN generated by the first circuit 110 of FIGS. 4A and 4B is applied to a source electrode of the third NMOS transistor TN3 in FIG. 5. As such, the size of the sequential circuit may be reduced by combining the portions of the data path.

Figure 6:
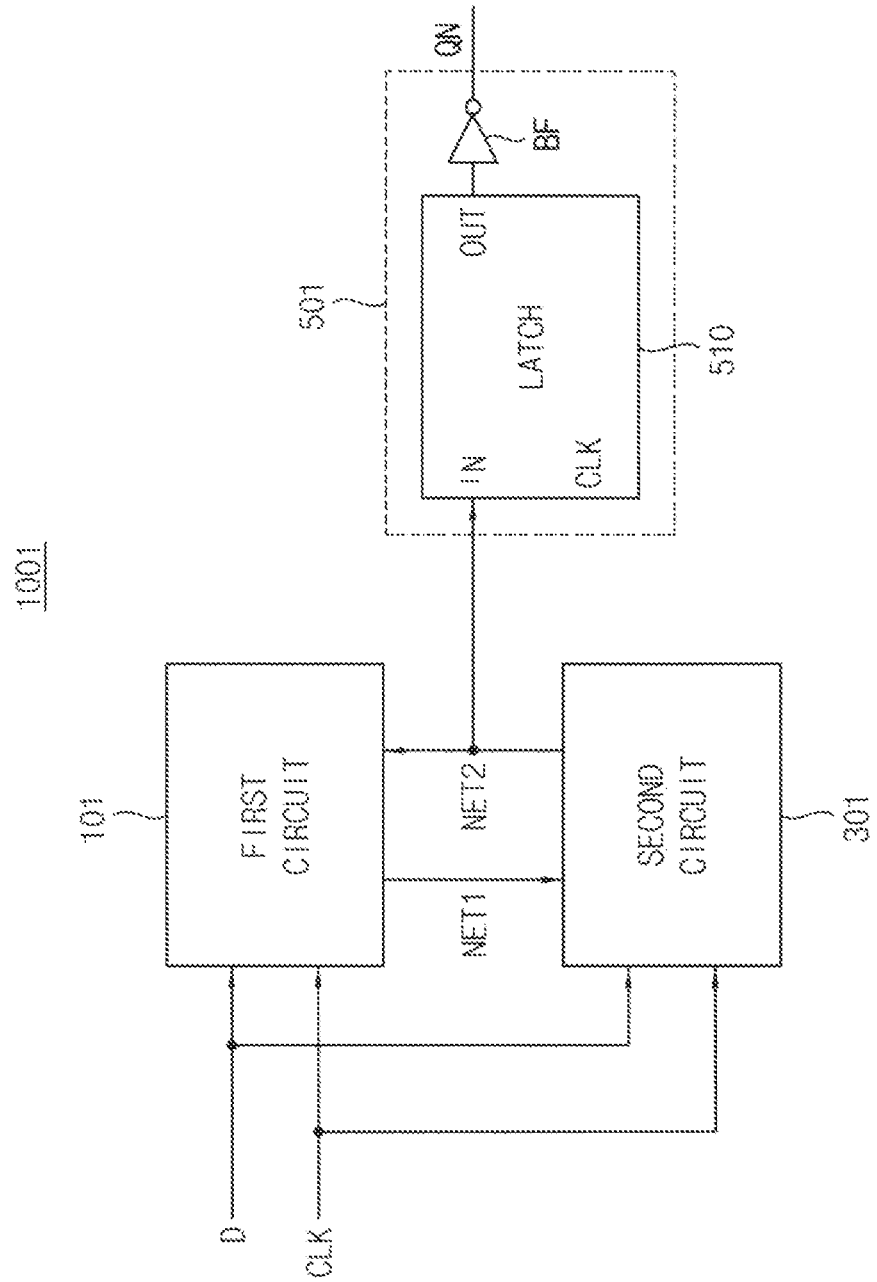
FIG. 6 is a block diagram illustrating a sequential circuit according to example embodiments.

FIG. 6 is a block diagram illustrating a sequential circuit according to example embodiments.

Referring to FIG. 6, a sequential circuit 1001 includes a first circuit 101, a second circuit 301 and an output circuit 501. The sequential circuit 1001 of FIG. 6 corresponds to a flip-flop that receives, as an input signal INP, an input data signal D, and generates, as an output signal OUT, an output data signal QN corresponding to the input data signal D.

The first circuit 101 generates a first signal NET1 based on the input data signal D, an input clock signal CLK and a second signal NET2. The second circuit 301 generates an internal clock signal CLKD by performing a NOR operation on the first signal NET1 and an inversion clock signal CLKB which is inverted from the input clock signal CLK, and generates the second signal NET2 based on the internal clock signal CLKD and the input data signal D. The output circuit 501 generates the output data signal QN based on the second signal NET2. The output circuit 501 may include a latch circuit 510 and a buffer BF. The latch circuit 510 latches the second signal NET2, and the buffer BF generates the output data signal QN by buffering the output signal of the latch circuit 510. Even though FIG. 6 illustrates an inverter as the buffer BF, the buffer BF is not limited to an inverter and may have various configurations.

Figure 7:
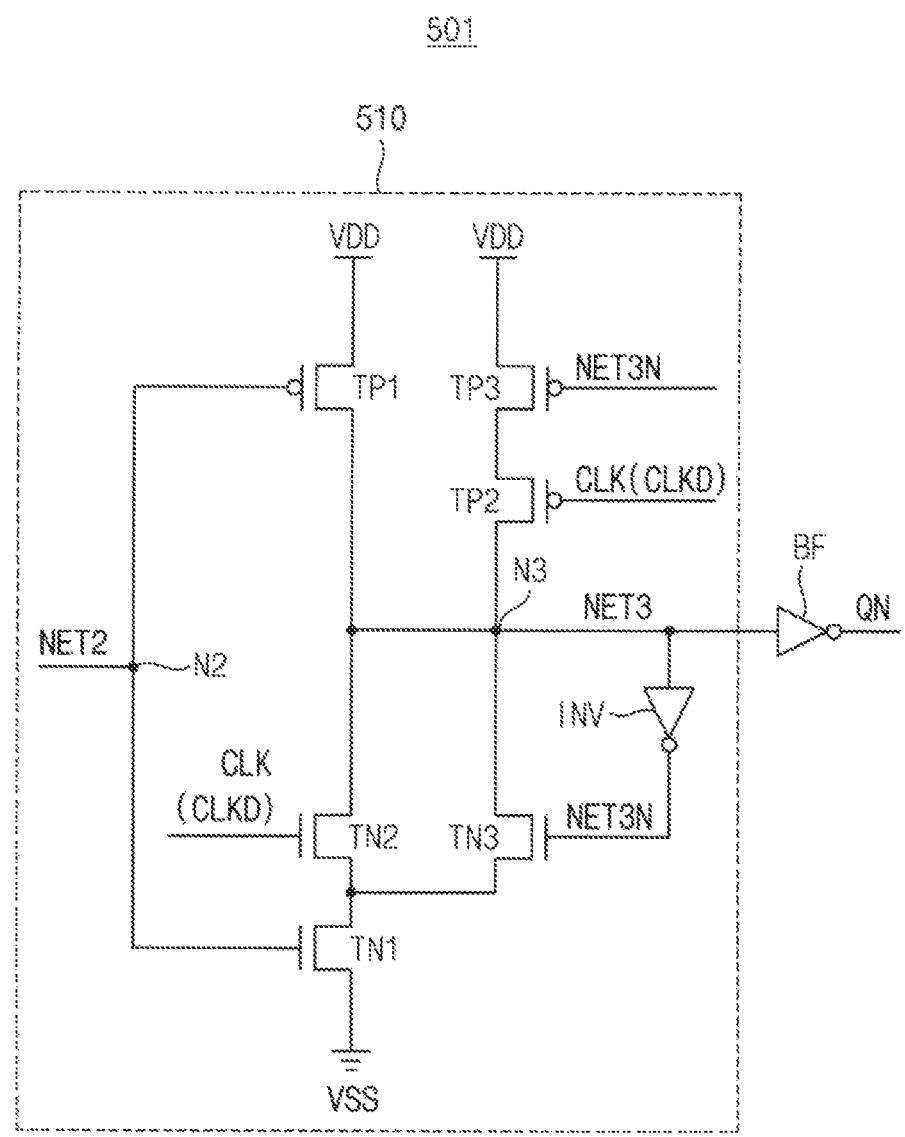
FIG. 7 is a circuit diagram illustrating an example embodiment of an output circuit included in the sequential circuit of FIG. 6.

FIG. 7 is a circuit diagram illustrating an example embodiment of the output circuit 500 included in the sequential circuit 1000 of FIG. 6.

Referring to FIG. 7, the latch circuit 510 of the output circuit 501 may be implemented with a plurality of transistors.

The latch circuit 510 may include a first PMOS transistor TP1, a second PMOS transistor TP2, a third PMOS transistor TP3, a first NMOS transistor TN1, a second NMOS transistor TN2, a third NMOS transistor TN3 and an inverter INV.

The first PMOS transistor TP1 is connected between a power supply voltage VDD and a third node N3 generating a third signal NET3, and receives the second signal NET2. The first NMOS transistor TN1 is connected between a ground voltage VSS and the third node N3, and receives the second signal NET2. The second PMOS transistor TP2 is connected in parallel to the first PMOS transistor TP1 between the power supply voltage VDD and the third node N3, and receives the input clock signal CLK or the internal clock signal CLKD. The second NMOS transistor TN2 is connected in series with the first NMOS transistor TN1 between the ground voltage VSS and the third node N3, and receives the input clock signal CLK or the internal clock signal CLKD. The third PMOS transistor TP3 is connected in series with the second PMOS transistor TP2 between the power supply voltage VDD and the third node N3, and receives a third inversion signal NET3N which is inverted from the third signal NET3. The third NMOS transistor TN3 is connected in parallel to the second NMOS transistor TN2 between the ground voltage VSS and the third node N3, and receives the third inversion signal NET3N. The inverter INV generates the third inversion signal NET3N by inverting the third signal NET3.

Figure 8A:
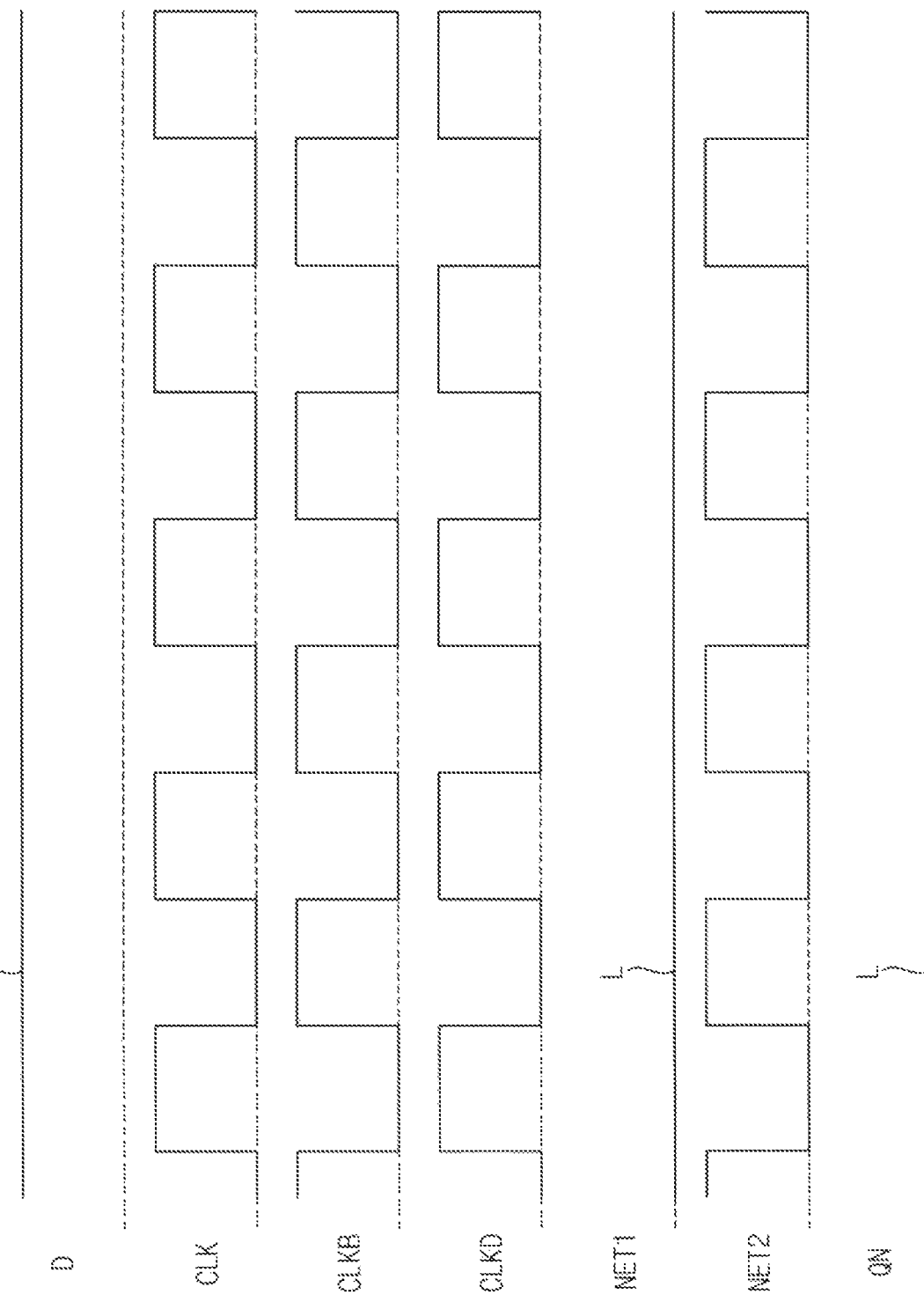
FIGS. 8A and 8B are timing diagrams illustrating operations of a sequential circuit according to example embodiments.
Figure 8B:
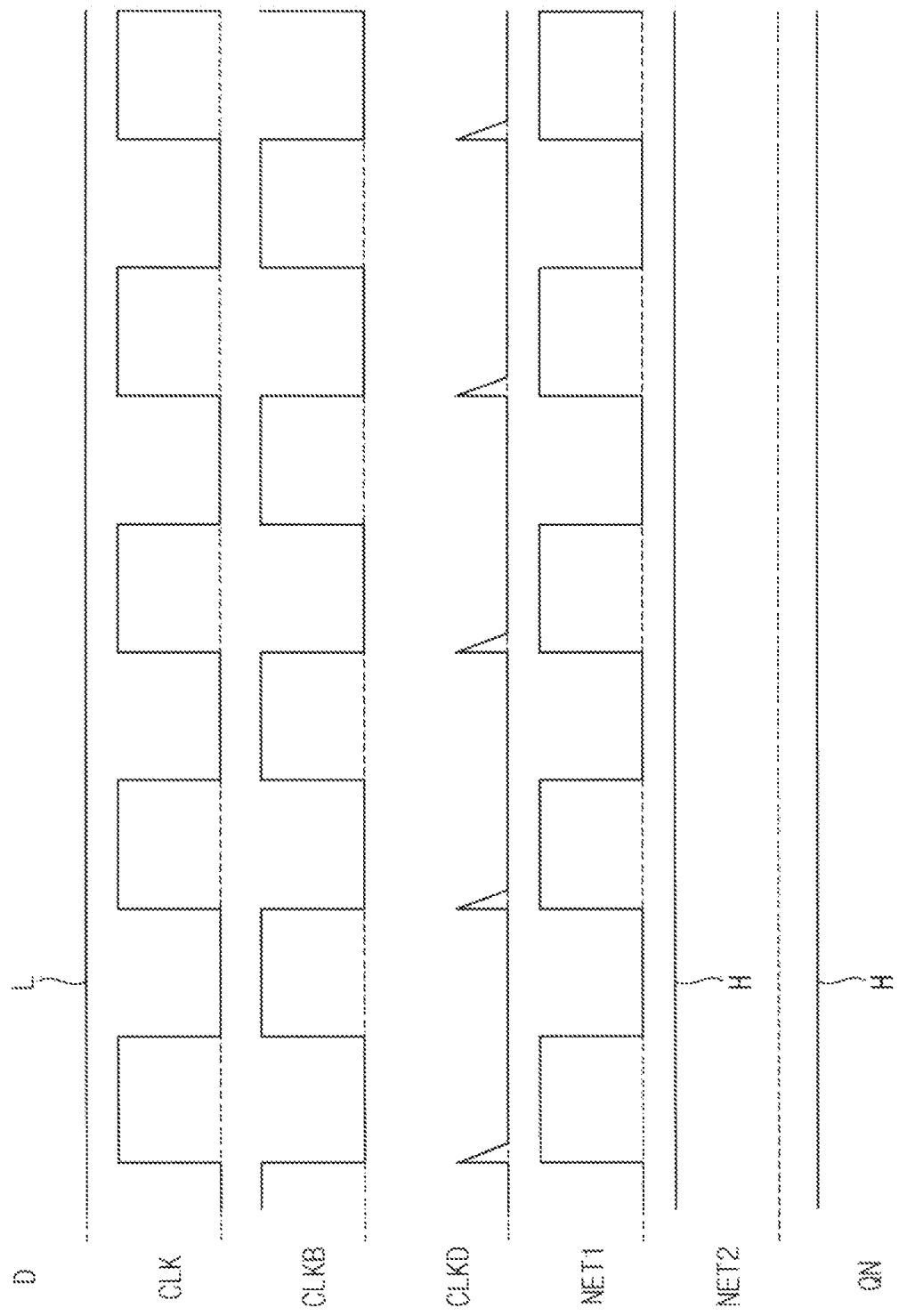

FIGS. 8A and 8B are timing diagrams illustrating operations of a sequential circuit according to example embodiments.

FIG. 8A illustrates a case that the input data signal D has a second logic level, e.g., a logic high level H, and FIG. 8B illustrates a case that the input data signal D has a first logic level, e.g., a logic low level L. With respect to each case, the input clock signal CLK, the internal clock signal CLKD, the internal clock signal CLKD, the first signal NET1, the second signal NET2 and the output signal OUT are illustrated. In FIGS. 8A and 8B, the delays between the signals are neglected.

Referring to FIGS. 8A and 8B, when the input clock signal CLK has the first logic level L, the first signal NET1 has the first logic level L and the second signal NET2 has the second logic level H. In other words, when the input clock signal CLK has the first logic level L, the first signal NET1 may be discharged to the first logic level L and the second signal NET2 may be charged to the second logic level H.

One of the first signal NET1 and the second signal NET2 may transition depending on the logic level of the input data signal D at a time point when the input clock signal CLK transitions from the first logic level L to the second logic level H. For example, if the input data signal D has the second logic level H, the second signal NET2 may transitions downwardly from the second logic level H to the first logic level L at a rising edge of the input clock signal CLK. In contrast, if the input data signal D has the first logic level L, the first signal NET1 may transitions upwardly from the first logic level L to the second logic level H at a rising edge of the input clock signal CLK.

As a result, as illustrated in FIG. 8A, the first signal NET1 may maintain the discharged logic low level L and the second signal NET2 may toggle with a phase opposite to the input clock signal CLK, when the input data signal has the logic high level H. In contrast, as illustrated in FIG. 8B, the second signal NET2 may maintain the charged logic high level H and the first signal NET1 may toggle with a phase identical to the input clock signal CLK, when the input data signal has the logic low level L.

Figure 9A:
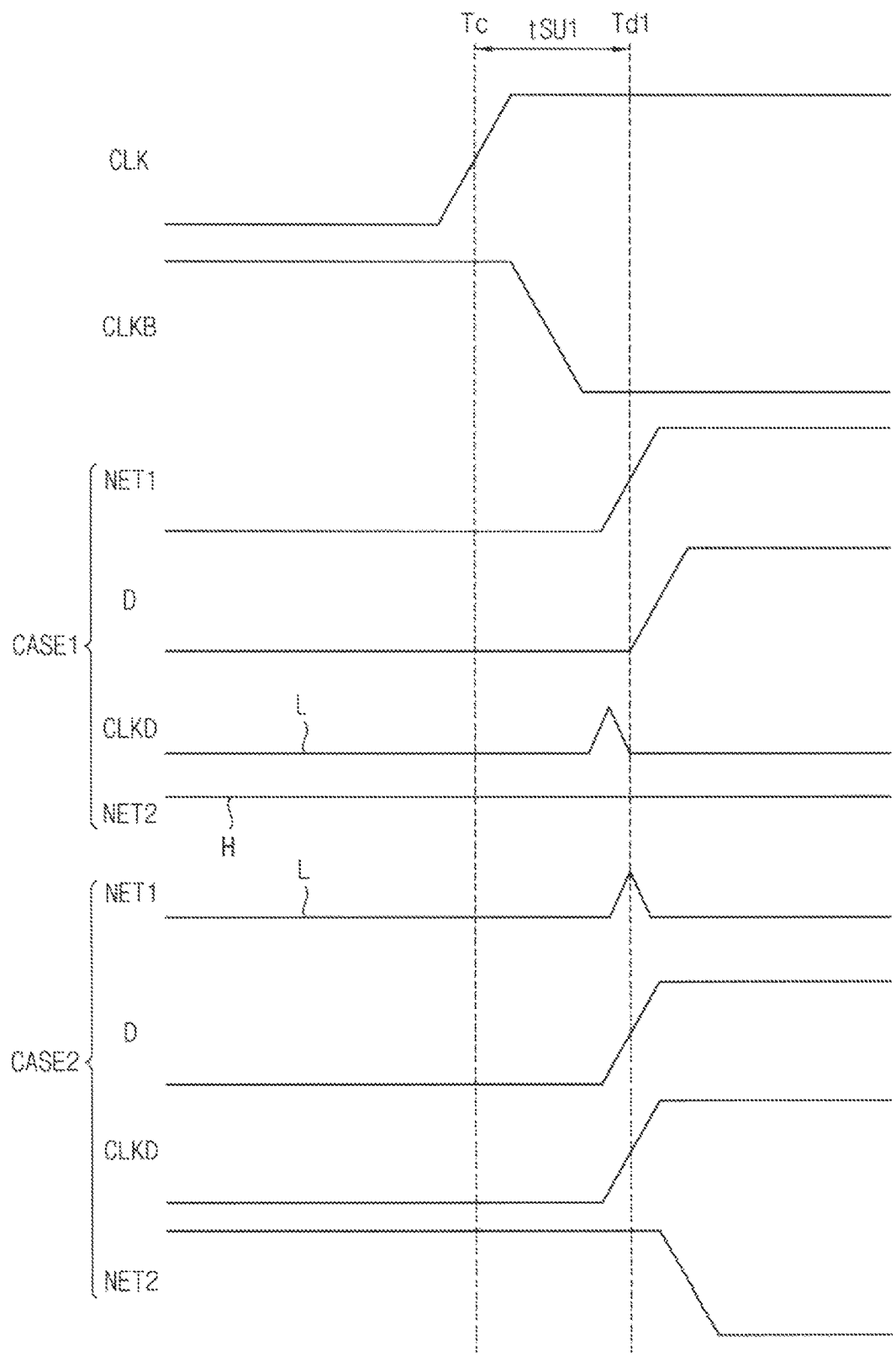
FIGS. 9A and 9B are timing diagrams illustrating a negative setup time of a sequential circuit according to example embodiments.
Figure 9B:
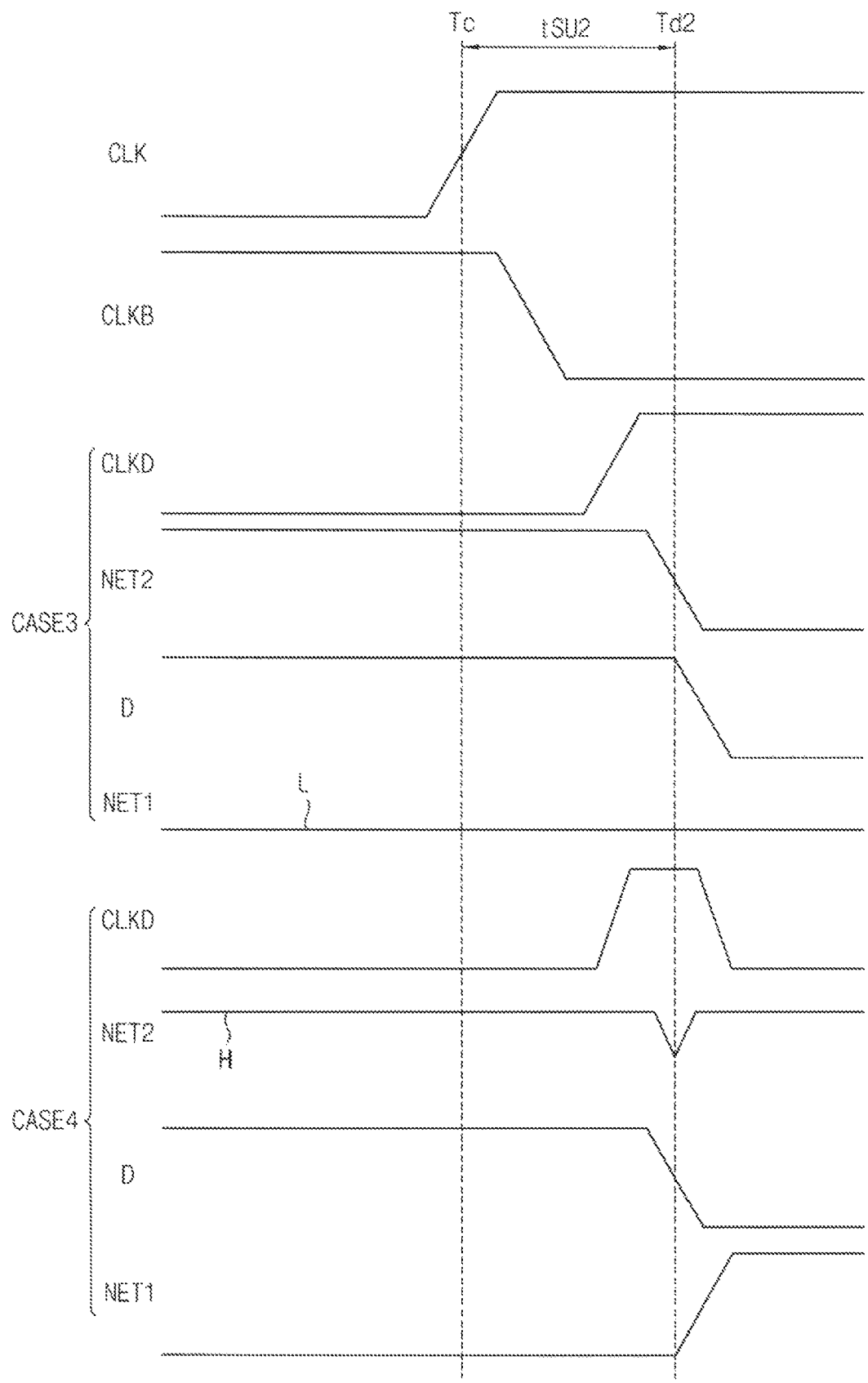

FIGS. 9A and 9B are timing diagrams illustrating a negative setup time of a sequential circuit according to example embodiments.

FIG. 9A illustrates a negative setup time tSU1 when the input data signal D transitions from the first logic level or the logic low level L to the second logic level or the logic high level H, and FIG. 9B illustrates a negative setup time tSU2 when the input data signal D transitions from the logic high level H to the logic low level L. Tc indicates a transitioning time point of the input clock signal CLK, Td1 indicates a transitioning time point of the first signal NET1 and Td2 indicates a transitioning time point of the second signal NET2.

When the input data signal D transitions from the logic low level L to the logic high level H, the negative setup time corresponds to a first delay time tSU1 from the transitioning time point Tc of the input clock signal CLK to the transitioning time point Td1 of the first signal NET1. In contrast, when the input data signal D transitions from the logic high level H to the logic low level L, the negative setup time corresponds to a second delay time tSU2 from the transitioning time point Tc of the input clock signal CLK to the transitioning time point Td2 of the second signal NET2.

Referring to FIG. 9A, a first case CASE1 is that the input data signal D transitions upwardly after the transitioning time point Td1 of the first signal NET1, and a second case CASE2 is that the input data signal D transitions upwardly before or at the transitioning time point Td1 of the first signal NET1. Referring to FIG. 9B, a third case CASE3 is that the input data signal D transitions downwardly after the transitioning time point Td2 of the second signal NET2 and a fourth case CASE4 is that the input data signal D transitions downwardly before or at the transitioning time point Td2 of the second signal NET2.

As the second case CASE2 and the fourth case CASE4, if the input data signal D transitions before the negative setup time tSU1 or tSU2 elapses from the time point Tc when the input clock signal CLK transitions from the logic low level L to a logic high level H, one of the first signal NET1 and the second signal NET2 may transition.

In contrast, as the first case CASE1 and the third case CASE3, if the input data signal D transitions after the negative setup time tSU1 or tSU2 elapses from the time point Tc, that is, the sampling time point, both of the first signal NET1 and the second signal NET2 do not transition.

After the first signal NET1 is charged completely to the logic high level H, or the second signal NET2 is discharged completely to the logic low level L, the output of the sequential circuit is not affected by the change of the input data signal D. In contrast, the output of the sequential circuit may be affected if the input data signal D is changed before the first signal NET1 is charged completely to the logic high level H, or the second signal NET2 is discharged completely to the logic low level L.

As such, the sequential circuit according to example embodiments may have the increased negative setup time reflecting a transition of the input signal after a transition of the input clock signal, through mutual controls between the first circuit and the second circuit, and thus, the operation speed of the sequential circuit and the integrated circuit including the sequential circuit may be increased. In addition, the sequential circuit according to example embodiments may include only a single stage of a gate circuit on a data transfer path in the second circuit to reduce a data output delay, and thus, the operation speed of the sequential circuit and the integrated circuit may be increased.

Figure 10A:
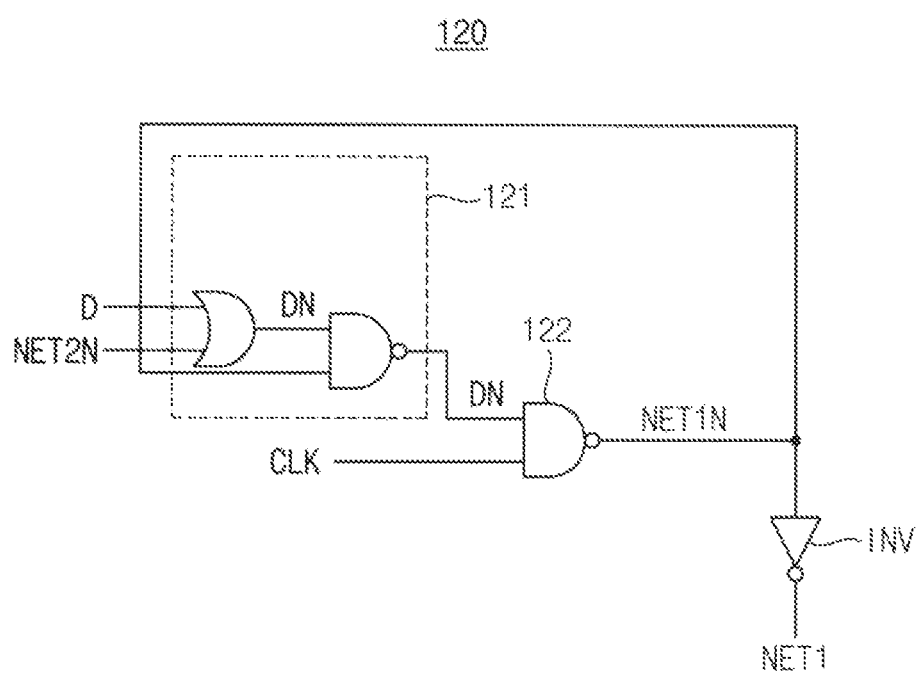
FIG. 10A is a block diagram illustrating an example embodiment of a first circuit included in the sequential circuit of FIG. 1

FIG. 10A is a block diagram illustrating an example embodiment of the first circuit 100 included in the sequential circuit 1000 of FIG. 1 and FIG. 10B is a circuit diagram illustrating an example embodiment of the first circuit of FIG. 10A.

Referring to FIG. 10A, a first circuit 120 may include a first gate circuit 121, a second gate circuit 122 and an inverter INV.

The first gate circuit 121 generate an internal signal DN by performing a NOR operation on an input data signal D corresponding to the input signal INP and a second inversion signal NET2N which is inverted from the second signal NET2. The first gate circuit 121 may be implemented as an OAI gate.

The second gate circuit 122 may generate a first inversion signal NET1N by performing a NAND operation on the input clock signal CLK and the internal signal DN. The inverter INV generates the first signal NET1 by inverting the first inversion signal NET1N. The second gate circuit 122 may be implemented as a NAND gate.

Referring to FIG. 10B, the first gate circuit 121 and the second gate circuit 122 of the first circuit 120 may be implemented with a plurality of transistors TP1 through TP5 and TN1 through TN5. FIG. 10B illustrates an example of a transistor-level configuration corresponding to the configuration of FIG. 10A. The operation of the first circuit 120 of FIG. 10B is substantially the same as described with referent to FIGS. 8A, 8B and 9A and 9B, and the repeated descriptions are omitted.

Figure 11A:
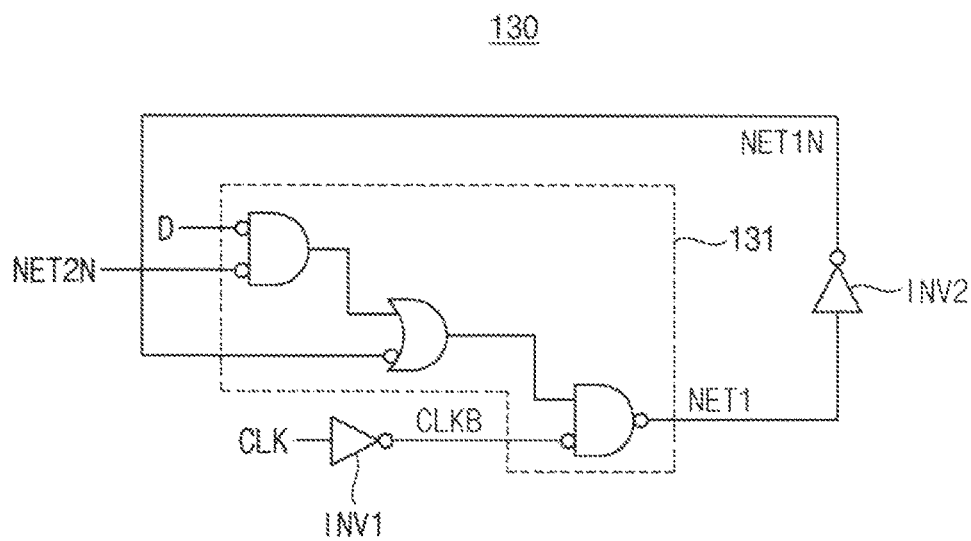
FIG. 11A is a block diagram illustrating an example embodiment of a first circuit included in the sequential circuit of FIG. 1
Figure 11B:
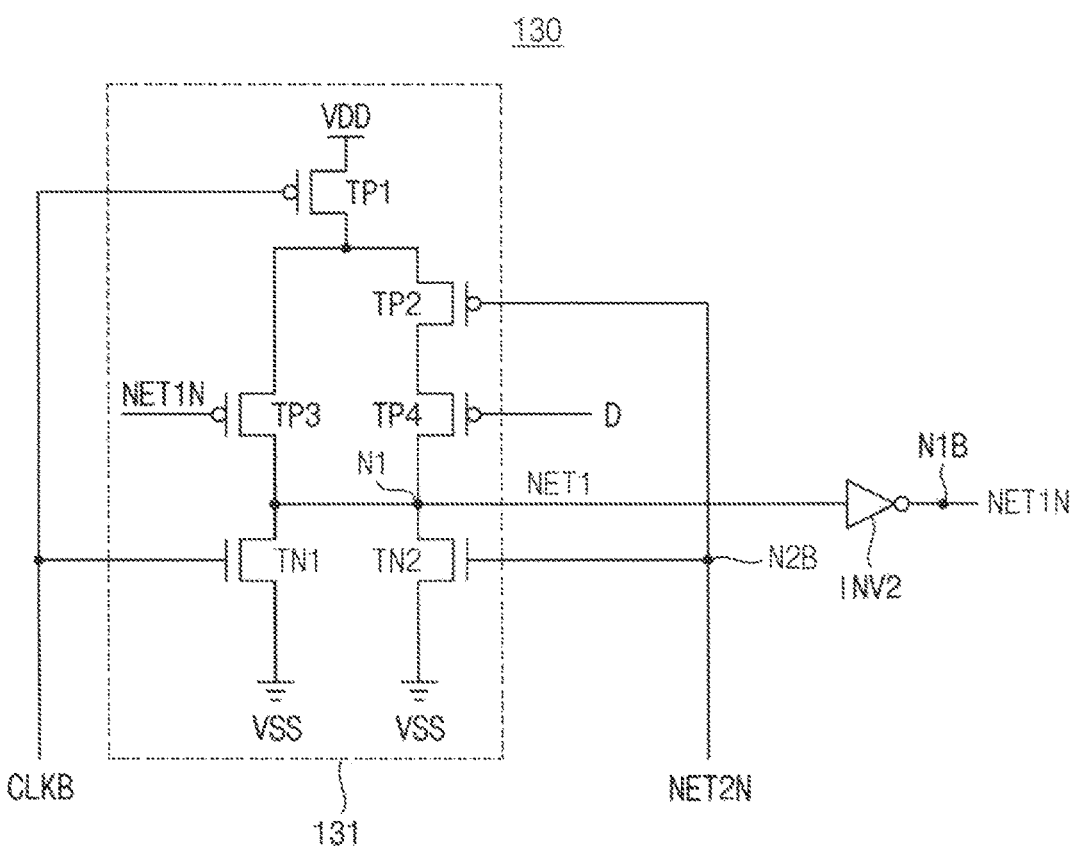
FIG. 11B is a circuit diagram illustrating an example embodiment of the first circuit of FIG. 11A.

FIG. 11A is a block diagram illustrating an example embodiment of the first circuit 100 included in the sequential circuit 1000 of FIG. 1 and FIG. 11B is a circuit diagram illustrating an example embodiment of the first circuit of FIG. 11A.

Referring to FIG. 11A, a first circuit 130 may include a gate circuit 131, a first inverter INV1 and a second inverter INV2.

The gate circuit 131 may generate a first signal NET1 by performing logic operations on an input data signal D corresponding to the input signal INP, a second inversion signal NET2N which is inverted from the second signal NET2, a first inversion signal NET1N which is inverted from the first signal NET1 and an inversion clock signal CLKB which is inverted from the input clock signal CLK. The first inverter INV1 generates the inversion clock signal CLKB by inverting the input clock signal CLK. The second inverter INV2 generates the first inversion signal NET1N by inverting the first signal NET1. According to example embodiments, the first inverter INV1 may be omitted, the inversion clock signal CLKB may be provided from the external.

Referring to FIG. 11B, the gate circuit 131 of the first circuit 130 may be implemented with a plurality of transistors TP1 through TP4, TN1 and TN2. FIG. 11B illustrates an example of a transistor-level configuration corresponding to the configuration of FIG. 11A. The operation of the first circuit 130 of FIG. 11B is substantially the same as described with referent to FIGS. 8A, 8B and 9A and 9B, and the repeated descriptions are omitted.

Figure 12:
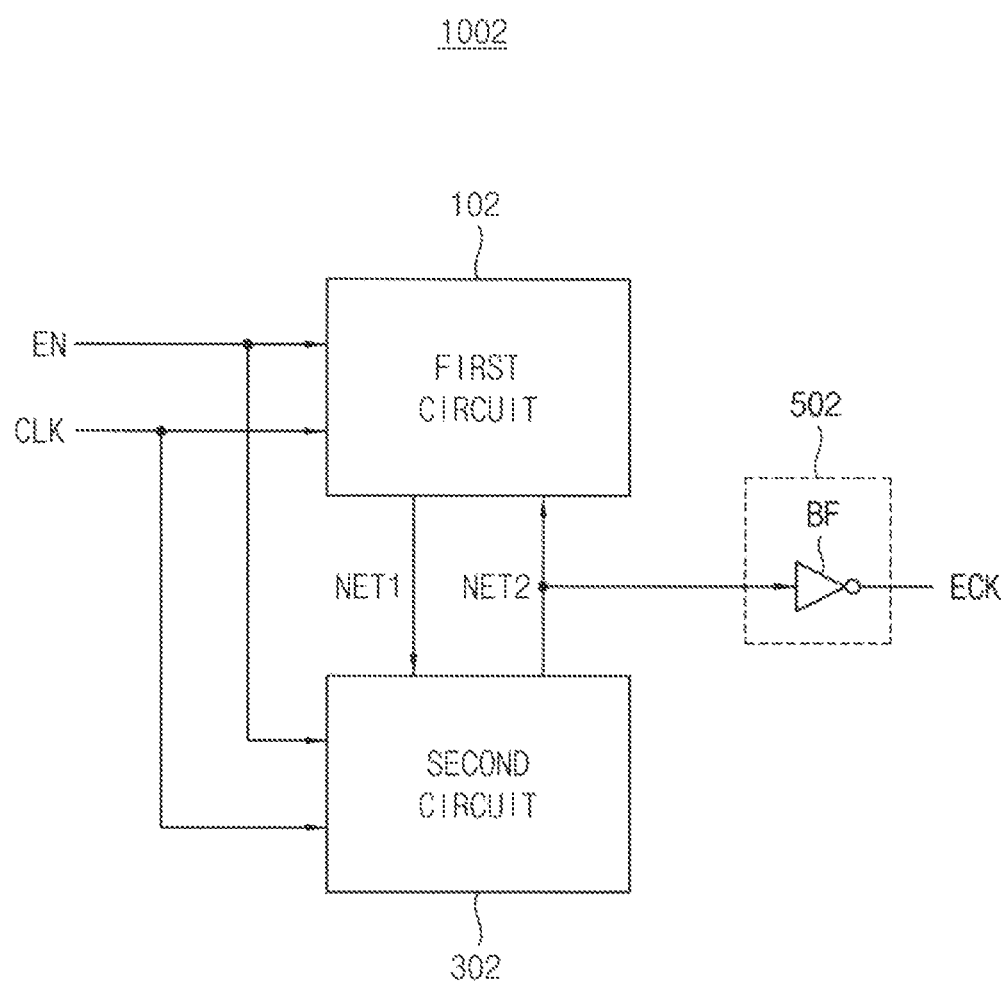
FIG. 12 is a block diagram illustrating a sequential circuit according to example embodiments.

FIG. 12 is a block diagram illustrating a sequential circuit according to example embodiments.

Referring to FIG. 12, a sequential circuit 1002 includes a first circuit 102, a second circuit 302 and an output circuit 502. The sequential circuit 1002 of FIG. 12 corresponds to a clock gating circuit that receives, as an input signal INP, a clock enable signal EN and generates, as an output signal OUT, an output clock signal ECK that toggles in response to an activation of a clock enable signal EN.

The first circuit 102 generates a first signal NET1 based on the clock enable signal EN, an input clock signal CLK and a second signal NET2. The second circuit 302 generates an internal clock signal CLKD by performing a NOR operation on the first signal NET1 and an inversion clock signal CLKB which is inverted from the input clock signal CLK, and generates the second signal NET2 based on the internal clock signal CLKD and the clock enable signal EN. The output circuit 502 generates the output clock signal ECK based on the second signal NET2. The output circuit 502 includes a buffer BF and does not include the latch circuit in the output circuit 501 in FIG. 6. Even though FIG. 12 illustrates an inverter as the buffer BF, the buffer BF is not limited to an inverter and may have various configurations.

The first circuit 102 and the second circuit 302 included in the sequential circuit 1002 of FIG. 12 may be implemented using the first circuit and the second circuit as described with referent to FIGS. 3A through 11B, by replacing the input data signal D with the clock enable signal EN.

Figure 13A:
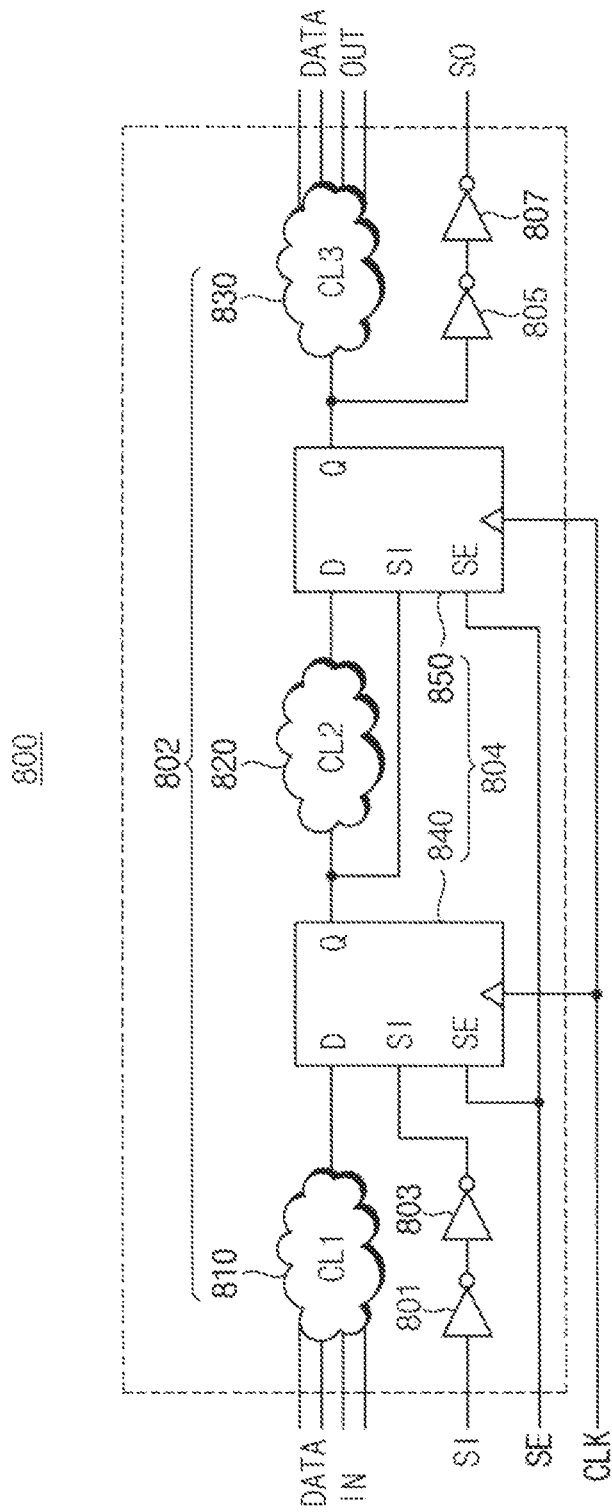
FIGS. 13A and 13B are diagrams illustrating a scan test circuit including a sequential circuit according to example embodiments.
Figure 13B:
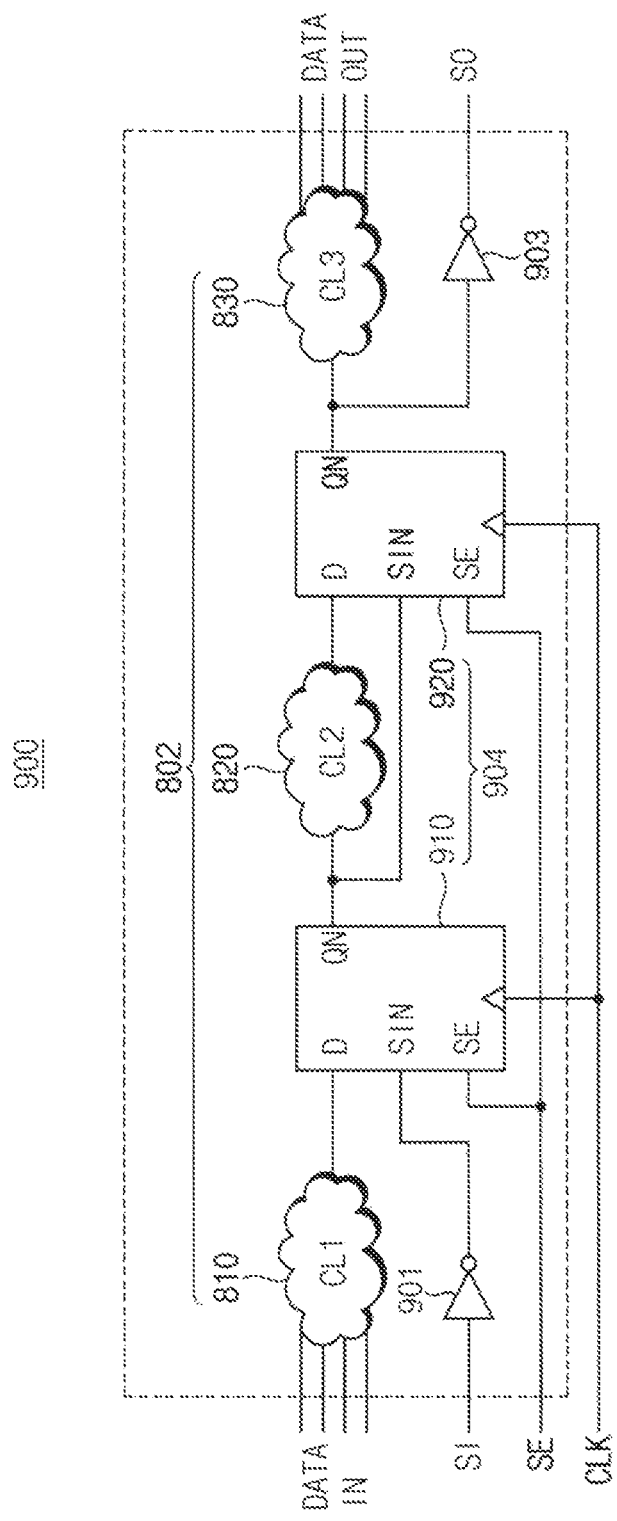

FIGS. 13A and 13B are diagrams illustrating a scan test circuit including a sequential circuit according to example embodiments.

DFT (device for testability) schemes for testing semiconductor chips are used widely. Among the DFT schemes, a scan test scheme is considered as an important solution to efficiently test semiconductor integrated circuits. A flip-flop having a scan input is designed for a convenient test of logic circuits. According to the scan test scheme, flip-flops in the logic circuit may form a shift register in a scan test mode, and a scan input may be applied to the shift register to observe a resulting output.

FIG. 13A illustrates a scan test circuit using a scan input signal SI, and FIG. 13B illustrates a scan test circuit using an inversion scan input signal SIN.

Referring to FIG. 13A, a scan test circuit 800 may include a combination circuitry 802, a sequential circuitry 804 and inverters 801, 803, 805 and 807. The combination circuitry 802 may include a plurality of logic circuits 810, 820 and 830. The sequential circuitry 804 may include a plurality of flip-flops including a first flip-flop 840 and a second flip-flop 850.

The first logic circuit 810 performs a logic operation on data DATA IN and provides input data D of the first flip-flop 840. The first flip-flop 840 operates in synchronization with an input clock signal CLK. A logic level of a scan enable signal SE may represent a normal mode or a scan test mode. The first flip-flop 840 provides output data Q corresponding to the input data D in the normal mode, and provides output data Q corresponding to a scan input signal SI in the scan test mode. The second logic circuit 820 performs a logic operation on the output data Q of the first flip-flop 840 and provides input data D of the second flip-flop 850.

The second flip-flop 850 receives the output data Q of the first flip-flop as a scan input SI and receives the scan enable signal SE and the input clock signal CLK. The third logic circuit 830 performs a logic operation on output data Q of the second flip-flop 850 and provides output data DATA OUT. The output data Q of the second flip-flop 850 may be provided as a scan output SO through the inverters 805 and 807 in the scan test mode.

Referring to FIG. 13B, a scan test circuit 900 may include a combination circuitry 802, a sequential circuitry 904 and inverters 901 and 903. The combination circuitry 802 may include a plurality of logic circuits 810, 820 and 830. The sequential circuitry 904 may include a plurality of flip-flops including a first flip-flop 910 and a second flip-flop 920. The scan test circuit 900 of FIG. 13B is similar to the scan test circuit 800 of FIG. 13A except that the first flip-flop 910 and the second flip-flop 920 in the scan test circuit 900 of FIG. 13B receive an inversion scan input signal SIN and output inversion output data QN, and the repeated descriptions are omitted.

The scan flip-flops included in the scan test circuits in FIGS. 13A and 13B may provide the output data corresponding to the scan input data SI in the scan test mode. In addition, the scan test circuits of FIGS. 13A and 13B may perform the logic operations of the input data DATA IN to provide the output data DATA OUT in the normal mode, and form a scan test path provide the scan output signal SO corresponding to the scan input signal SI to test the operation of the scan test circuit.

Hereinafter, example embodiments of a sequential circuit applicable to a flip-flop in a scan test circuit are provided.

Figure 14:
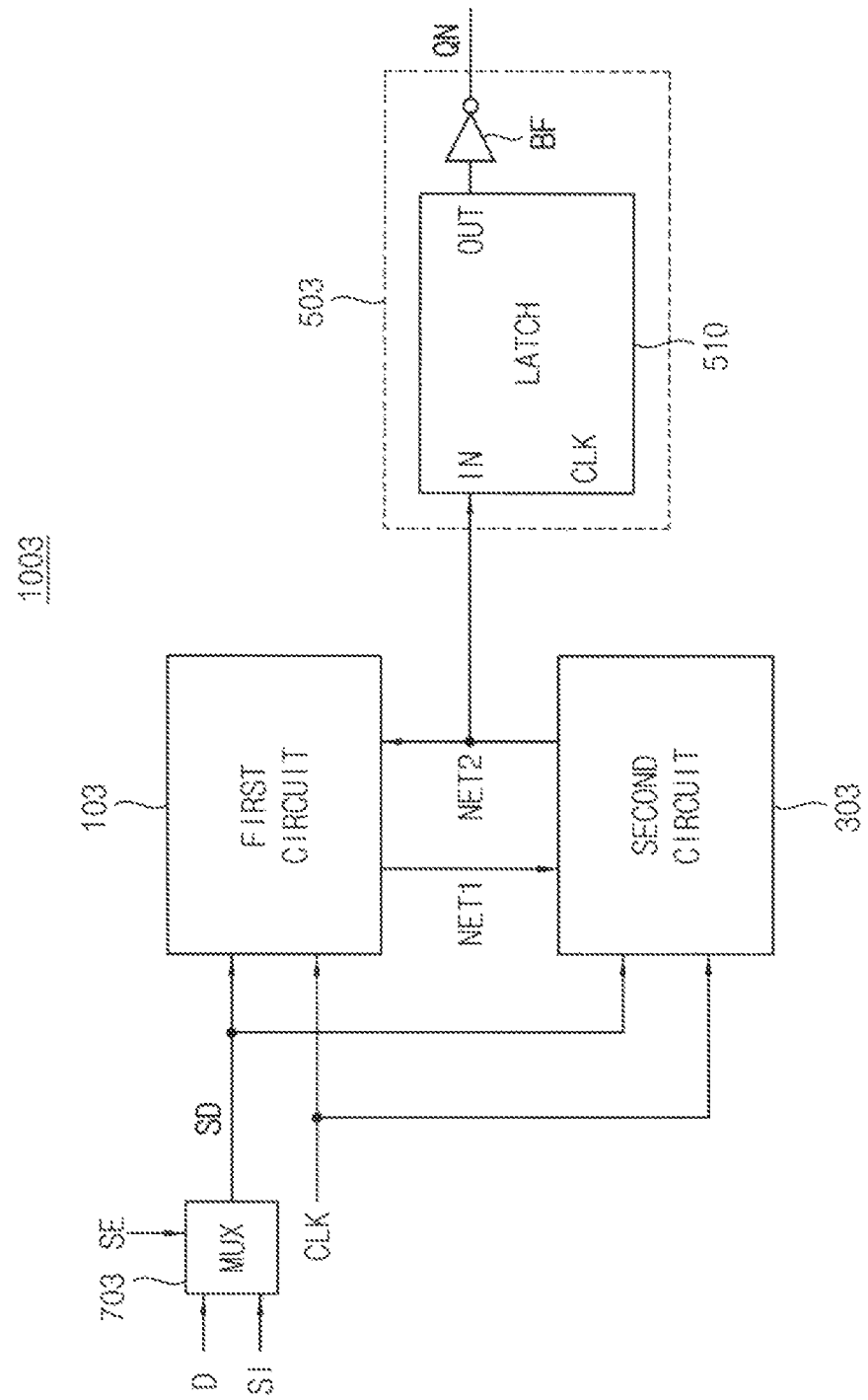
FIGS. 14 and 15 are block diagrams illustrating a sequential circuit having a scan test function according to example embodiments.
Figure 15:
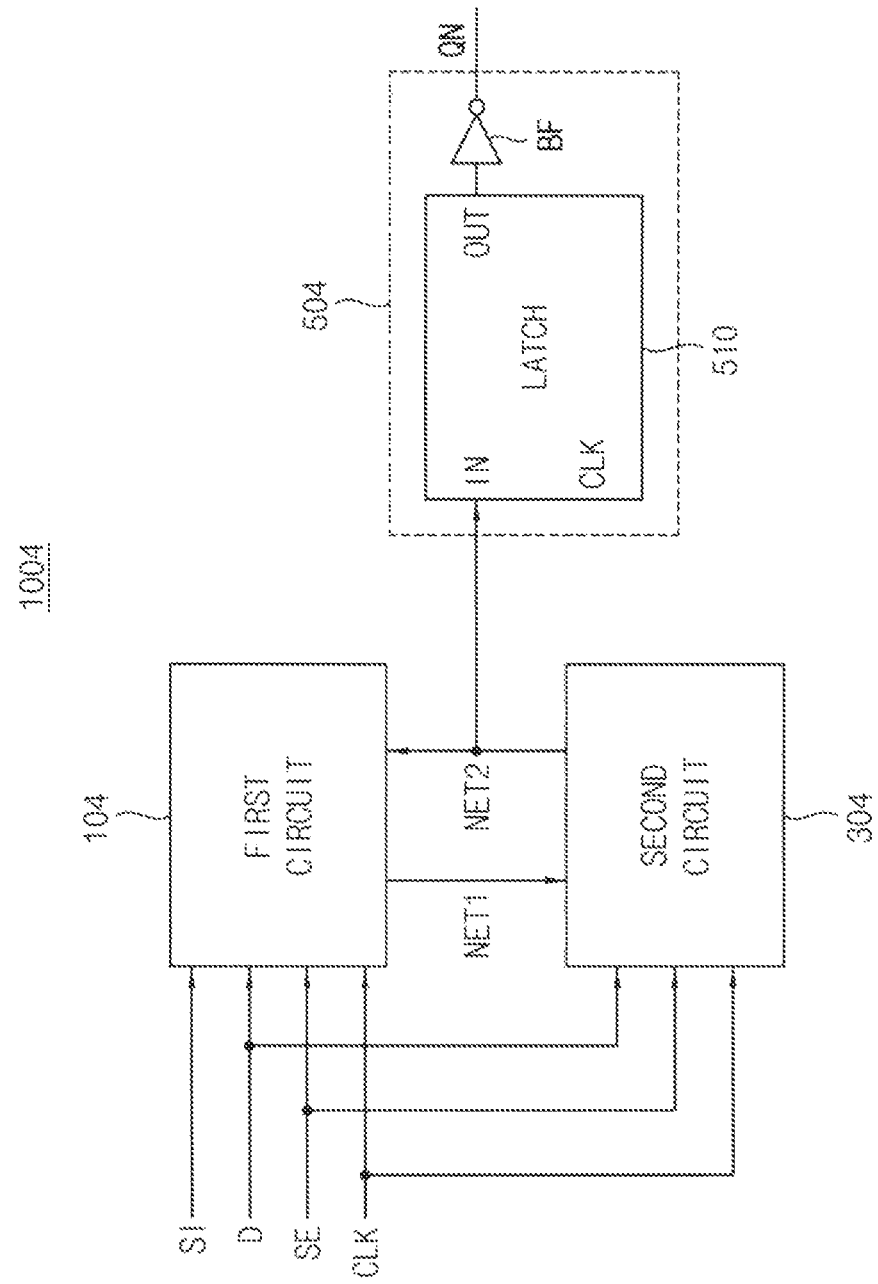

FIGS. 14 and 15 are block diagrams illustrating a sequential circuit having a scan test function according to example embodiments.

Referring to FIG. 14, a sequential circuit 1003 includes a first circuit 103, a second circuit 303, an output circuit 503 and a multiplexer MUX 703. The multiplexer 703 may select one of an input data signal D and a scan input signal SI in response to a scan enable signal SE to output a selected signal SD as the above-described input signal INP. The sequential circuit 1003 of FIG. 14 corresponds to a flip-flop that receives, as the input signal INP, the selected signal SD and generates, as the output signal OUT, an output data signal QN corresponding to the selected signal SD. The first circuit 103, the second circuit 303 and the output circuit 503 are substantially the same as described with referent to FIGS. 6 and 7, and the repeated descriptions are omitted.

If a scan test path is implemented by simply adding a scan multiplexer, additional flip-flops may be required in the sequential circuit and the delay time through a scan test path may be shorter than is required. In general, it is desirable to shorten the delay time of a normal path but the delay time of the scan test path has to be longer than the normal mode.

The disadvantage of the scan multiplexer may be cured by example embodiments of FIG. 15.

Referring to FIG. 15, a sequential circuit 1004 includes a first circuit 104, a second circuit 304 and an output circuit 504.

The first circuit 104 generates a first signal NET1 based on a scan input signal SI, an input data signal D, a scan enable signal SE, an input clock signal CLK and a second signal NET2. The second circuit 304 generates an internal clock signal CLKD by performing a NOR operation on the first signal NET1 and an inversion clock signal CLKB which is inverted from the input clock signal CLK, and generates the second signal NET2 based on the internal clock signal CLKD, the input data signal D and the scan enable signal SE. The output circuit 504 generates an output data signal QN based on the second signal NET2. The output circuit 504 may include a latch circuit 510 and a buffer BF. The latch circuit 510 latches the second signal NET2 and the buffer BF generates the output data signal QN by buffering an output signal of the latch circuit 510. Even though FIG. 12 illustrates an inverter as the buffer BF, the buffer BF is not limited to an inverter and may have various configurations.

Figure 16A:
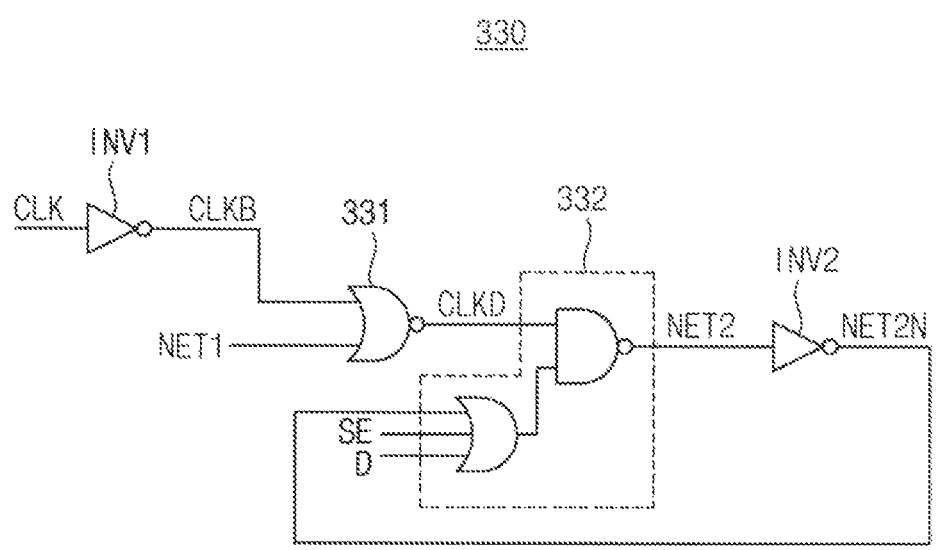
FIG. 16A is a block diagram illustrating an example embodiment of a second circuit included in the sequential circuit of FIG. 15
Figure 16B:
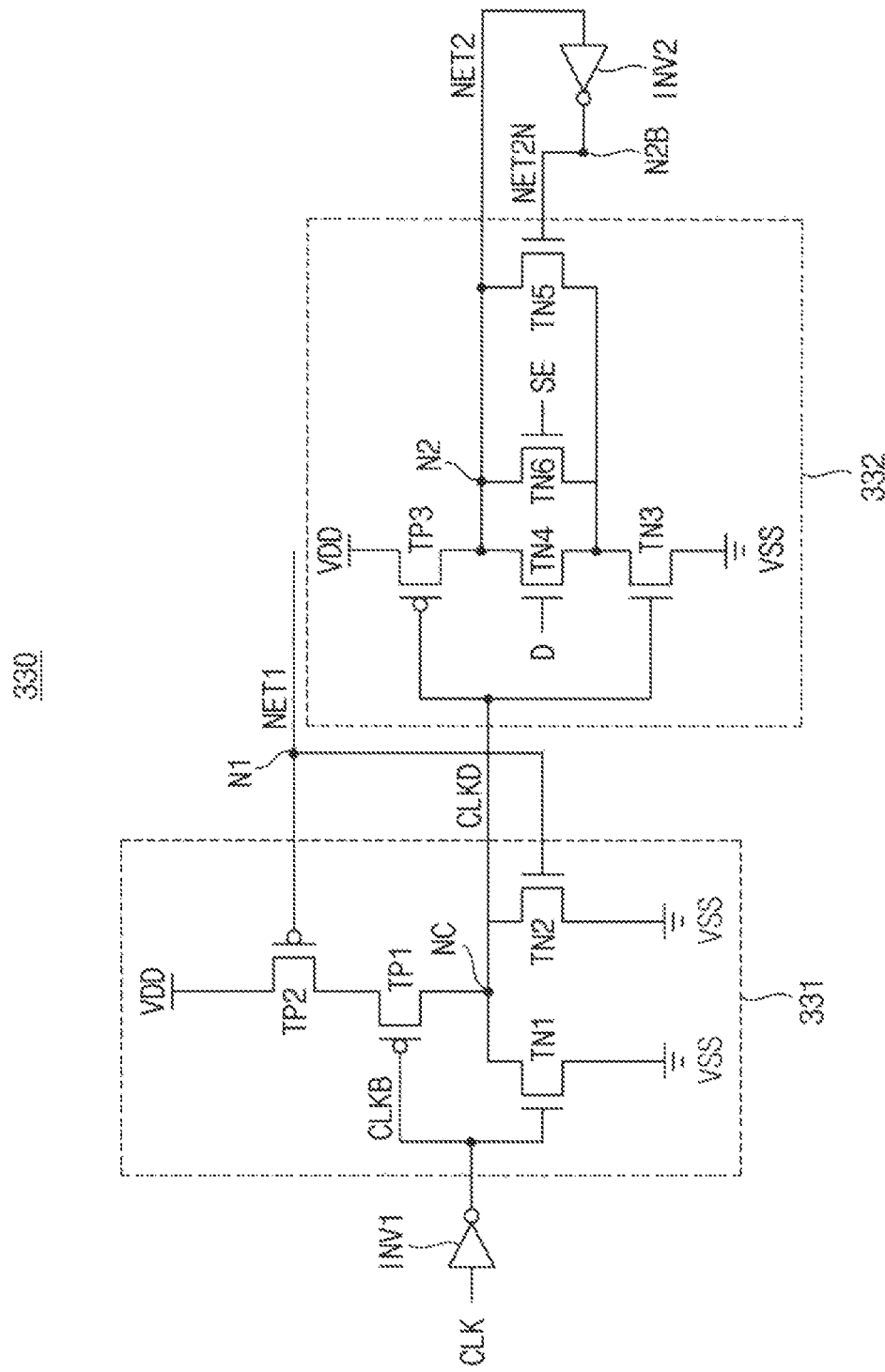
FIG. 16B is a circuit diagram illustrating an example embodiment of the second circuit of FIG. 16A.

FIG. 16A is a block diagram illustrating an example embodiment of the second circuit 304 included in the sequential circuit 1004 of FIG. 15, and FIG. 16B is a circuit diagram illustrating an example embodiment of the second circuit of FIG. 16A.

Referring to FIG. 16A, a second circuit 330 may include a first gate circuit 331, a second gate circuit 332, a first inverter INV1 and a second inverter INV2.

The first inverter INV1 inverts the input clock signal CLK to generate the inversion clock signal CLKB. The second inverter INV2 inverts the second signal NET2 to generate a second inversion signal NET2N. According to example embodiments, the first inverter INV1 may be omitted, the inversion clock signal CLKB may be provided from the external.

The first gate circuit 331 may generate the internal clock signal CLKD by performing the NOR operation on the first signal NET1 and the inversion clock signal CLKB. The first gate circuit 311 may be implemented as a NOR gate.

The second gate circuit 332 may generate the second signal NET2 by performing a NAND operation on the internal clock signal CLKD and an OR operation result of an input data signal D corresponding to the input signal INP, the second inversion signal NET2N and the scan enable signal SE.

Referring to FIG. 16B, the first gate circuit 331 and the second gate circuit 332 of the second circuit 330 may be implemented with a plurality of transistors TP1 through TP3 and TN1 through TN6. FIG. 16B illustrates an example of a transistor-level configuration corresponding to the configuration of FIG. 16A. The operation of the second circuit 330 of FIG. 16B may be easily understood by those skilled in the art referring to the descriptions with referent to FIGS. 8A, 8B and 9A and 9B, and the repeated descriptions are omitted.

Figure 17A:
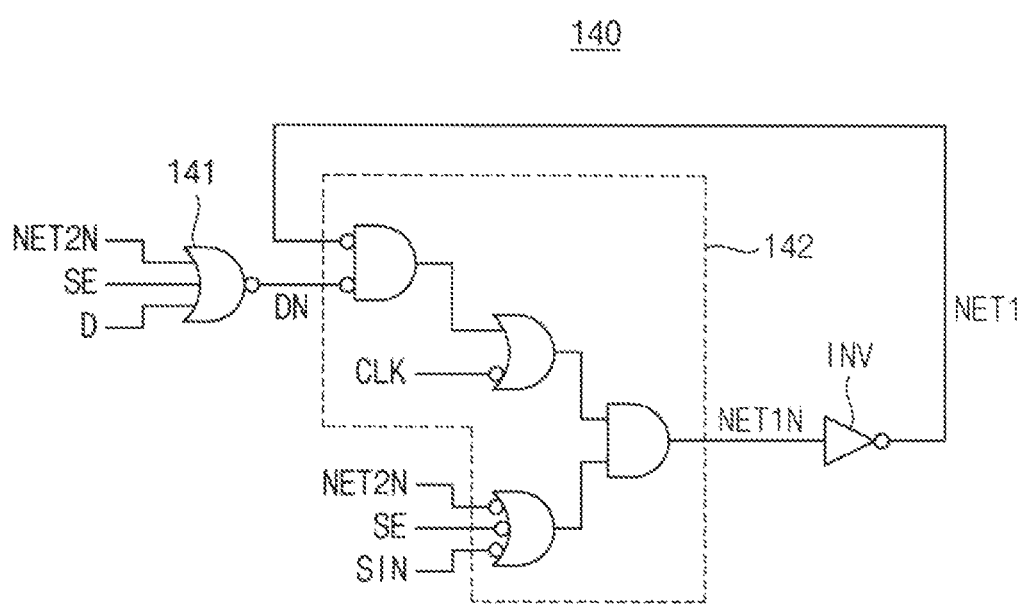
FIG. 17A is a block diagram illustrating an example embodiment of a first circuit included in the sequential circuit of FIG. 15
Figure 17B:
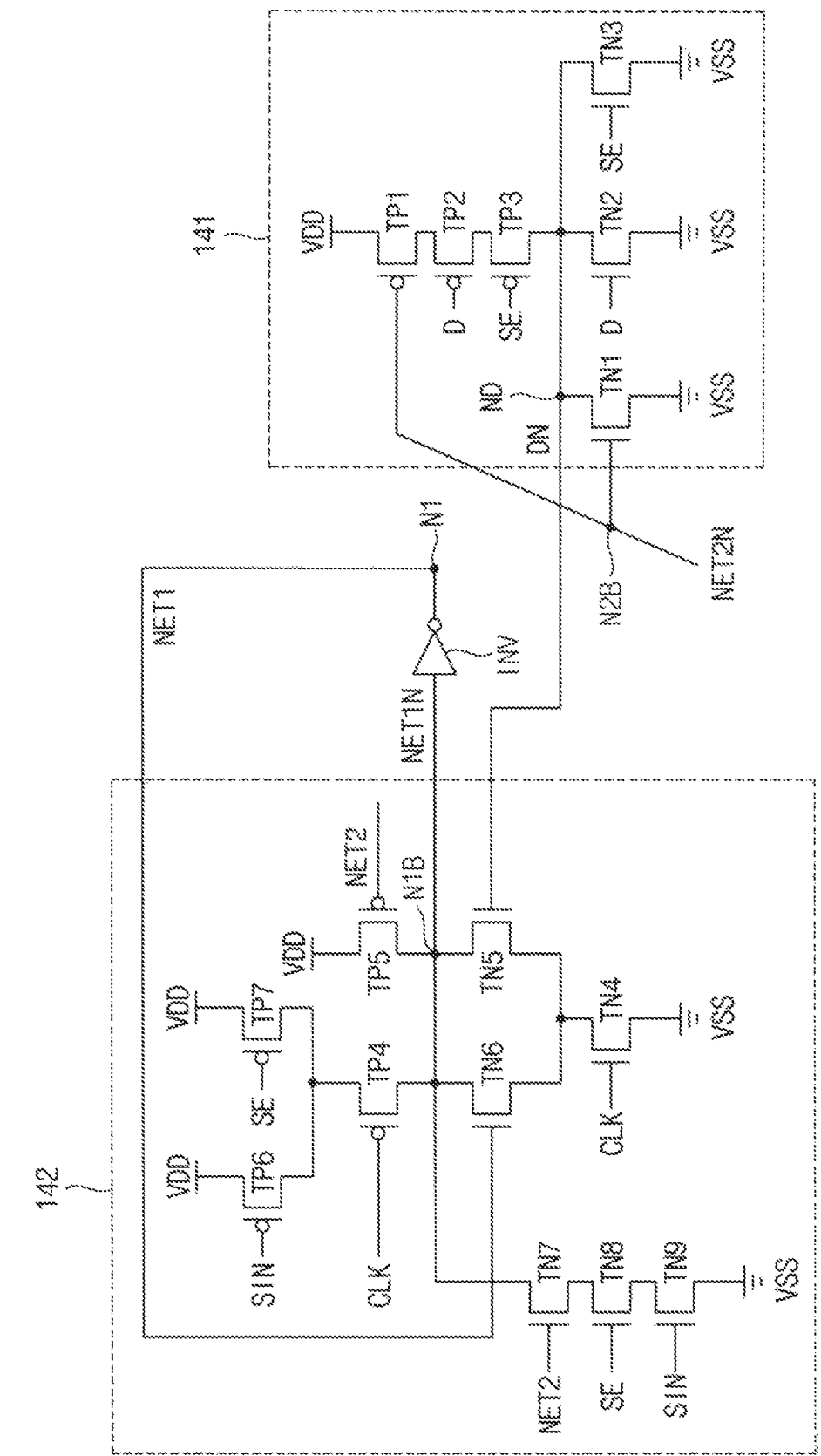
FIG. 17B is a circuit diagram illustrating an example embodiment of the first circuit of FIG. 17A.

FIG. 17A is a block diagram illustrating an example embodiment of the first circuit 104 included in the sequential circuit 1004 of FIG. 15, and FIG. 17B is a circuit diagram illustrating an example embodiment of the first circuit of FIG. 17A.

Referring to FIG. 17A, a first circuit 140 may include a first gate circuit 141, a second gate circuit 142 and an inverter INV.

The first gate circuit 141 may generate an internal signal DN by performing a NOR operation on an input data signal D corresponding to the input signal INP, a scan enable signal SE and a second inversion signal NET2N which is inverted from the second signal NET2. The second gate circuit 142 may generate a first inversion signal NET1N by performing a logic operation on the first signal NET1, the internal signal DN, the input clock signal CLK, the second inversion signal NET2N, the scan enable signal SE and the inversion scan input signal SIN. The inverter INV generates the first signal NET1 by inverting the first inversion signal NET1N.

Referring to FIG. 17B, the first gate circuit 141 and the second gate circuit 142 of the first circuit 140 may be implemented with a plurality of transistors TP1 through TP7 and TN1 through TN9. FIG. 17B illustrates an example of a transistor-level configuration corresponding to the configuration of FIG. 17A. The operation of the first circuit 140 of FIG. 17B may be easily understood by those skilled in the art referring to the descriptions with referent to FIGS. 8A, 8B and 9A and 9B, and the repeated descriptions are omitted.

Figure 18A:
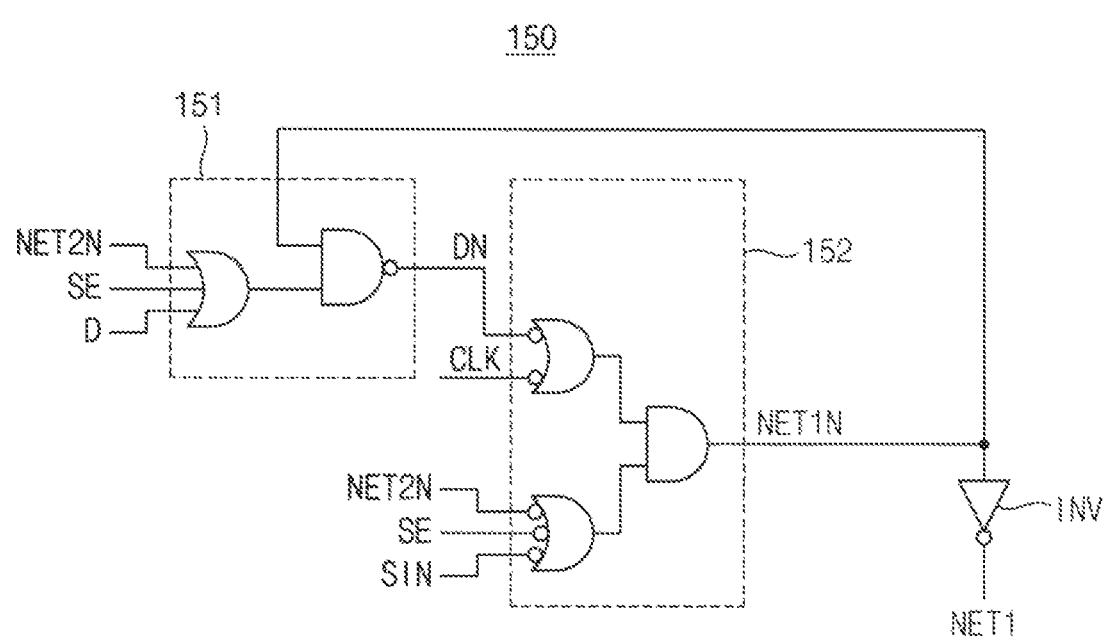
FIG. 18A is a block diagram illustrating an example embodiment of a first circuit included in the sequential circuit of FIG. 15

FIG. 18A is a block diagram illustrating an example embodiment of the first circuit 104 included in the sequential circuit 1004 of FIG. 15, and FIG. 18B is a circuit diagram illustrating an example embodiment of the first circuit of FIG. 18A.

Referring to FIG. 18A, a first circuit 150 may include a first gate circuit 151, a second gate circuit 152 and an inverter INV1.

The first gate circuit 151 may generate an internal signal DN by performing a NOR operation on an input data signal D corresponding to the input signal INP, a scan enable signal SE and a second inversion signal NET2N which is inverted from the second signal NET2. The second gate circuit 152 may generate a first inversion signal NET1N by performing a logic operation on the internal signal DN, the input clock signal CLK, the second inversion signal NET2N, the scan enable signal SE and the inversion scan input signal SIN. The inverter INV1 generates the first signal NET1 by inverting the first inversion signal NET1N.

Referring to FIG. 18B, the first gate circuit 151 and the second gate circuit 152 of the first circuit 150 may be implemented with a plurality of transistors TP1 through TP8 and TN1 through TN9. FIG. 18B illustrates an example of a transistor-level configuration corresponding to the configuration of FIG. 18A. The operation of the first circuit 150 of FIG. 18B may be easily understood by those skilled in the art referring to the descriptions with referent to FIGS. 8A, 8B and 9A and 9B, and the repeated descriptions are omitted.

Figure 19A:
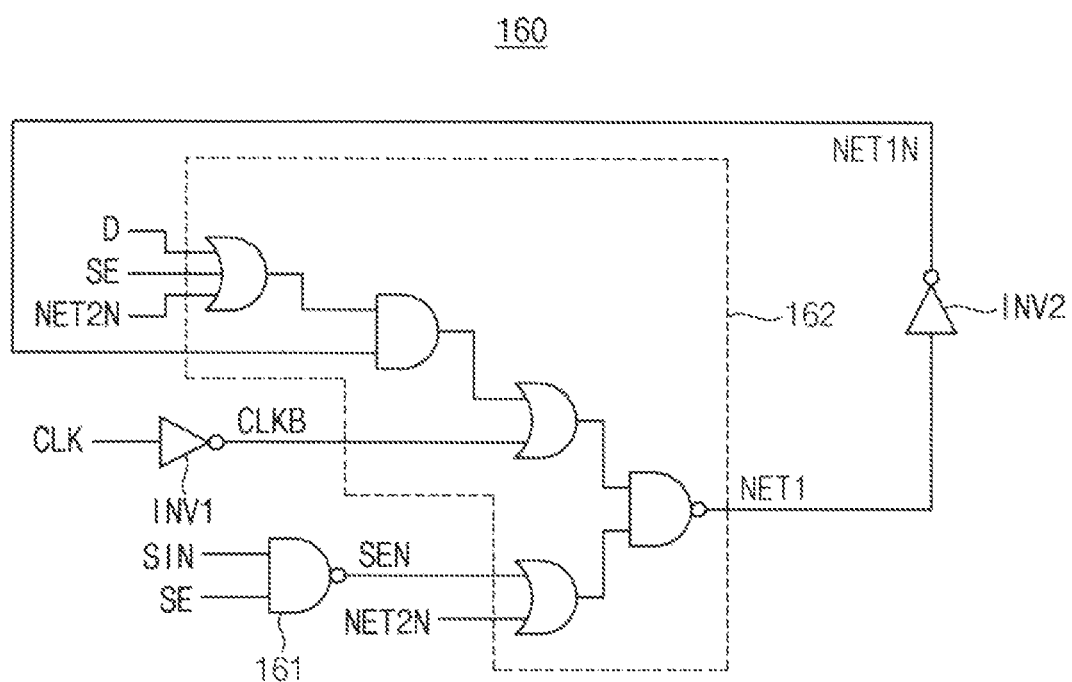
FIG. 19A is a block diagram illustrating an example embodiment of a first circuit included in the sequential circuit of FIG. 15

FIG. 19A is a block diagram illustrating an example embodiment of the first circuit 104 included in the sequential circuit 1004 of FIG. 15, and FIG. 19B is a circuit diagram illustrating an example embodiment of the first circuit of FIG. 19A.

Referring to FIG. 19A, a first circuit 160 may include a first gate circuit 161, a second gate circuit 162, a first inverter INV1 and a second inverter INV2.

The first gate circuit 161 may generate an internal enable signal SEN by performing a NAND operation on the inversion scan input signal SIN and the scan enable signal SE. The second gate circuit 162 may generate the first signal NET1 by performing a logic operation on the input data signal D, the scan enable signal SE, the second inversion signal NET2N, the first inversion signal NET1N, the inversion clock signal CLKB and the internal enable signal SEN. The first inverter INV1 generates the inversion clock signal CLKB by inverting the input clock signal CLK. The second inverter INV2 generates the first inversion signal NET1N by inverting the first signal NET1.

Referring to FIG. 19B, the first gate circuit 161 and the second gate circuit 162 of the first circuit 160 may be implemented with a plurality of transistors TP1 through TP9 and TN1 through TN5. FIG. 19B illustrates an example of a transistor-level configuration corresponding to the configuration of FIG. 19A. The operation of the first circuit 160 of FIG. 19B may be easily understood by those skilled in the art referring to the descriptions with referent to FIGS. 8A, 8B and 9A and 9B, and the repeated descriptions are omitted.

As described with referent to FIGS. 15 through 19B, during the scan test mode while the scan enable signal SE is activated, the second signal NET2 corresponding to the scan input signal SI or the inversion scan input signal SIN is generated by the scan test path via the first circuit and the second circuit. In contrast, during the normal mode while the scan enable signal SE is deactivated, the second signal NET2 corresponding to the input data signal D is generated via the second circuit. Through such scan test path and normal path, a delay time of the scan test path may be set to be longer than a delay time of the normal path.

In the scan test path, a logic circuit is not inserted between the flip-flops, and the output of the previous flip-flop is directly input to the next flip-flop. Accordingly the output of the previous stage may be transferred to the next stage before a hold time elapses. For success of the scan test, the data transferred between the flip-flops have to be maintained for the hold time from the transition of the input clock signal CLK. If the data transfer between flip-flops is too rapid during the scan test mode, the scan test fails. Thus the delay time is required to be increased, and the hold time is required to be decreased during the scan test mode.

As described above, the sequential circuit according to example embodiments may set the delay time of the scan test path longer than the delay time of the normal path. The operation speed of the normal mode may be increased and simultaneously the scan test may be supported efficiently.

Figure 20:
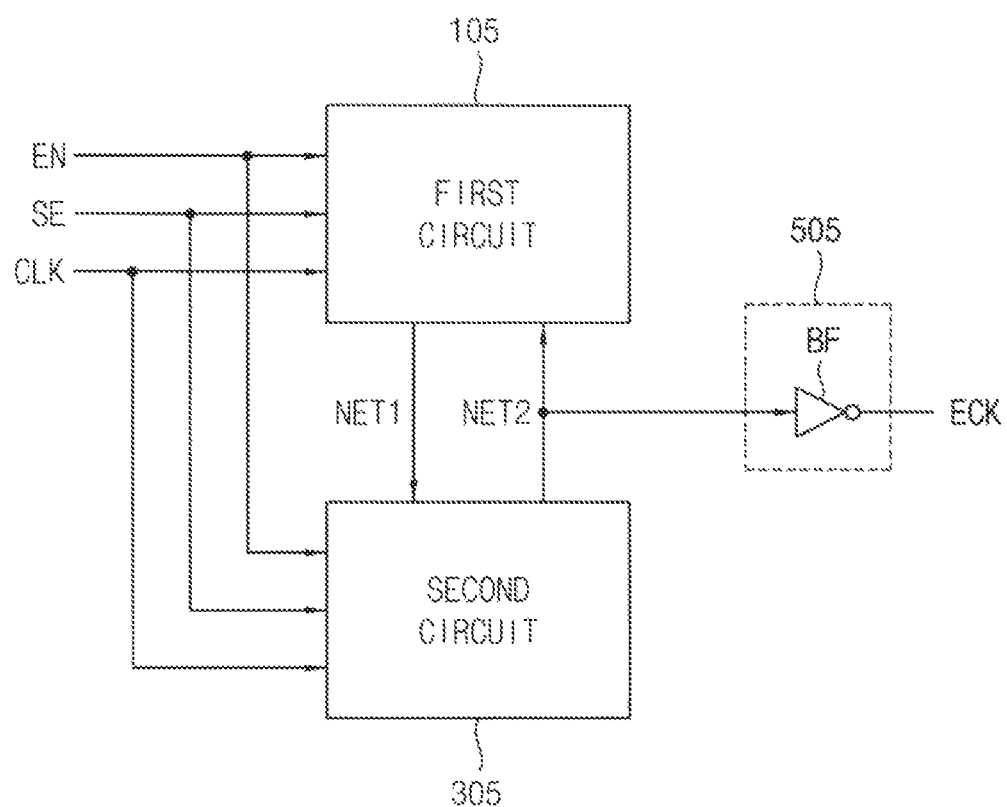
FIG. 20 is a block diagram illustrating a sequential circuit according to example embodiments.

FIG. 20 is a block diagram illustrating a sequential circuit according to example embodiments.

Referring to FIG. 20, a sequential circuit 1005 includes a first circuit 105, a second circuit 305 and an output circuit 505. The sequential circuit 1005 of FIG. 20 corresponds to a clock gating circuit that receives, as an input signal INP, a clock enable signal EN and generates, as an output signal OUT, an output clock signal ECK that toggles in response to an activation of the clock enable signal EN.

The first circuit 105 generates a first signal NET1 based on the clock enable signal EN, a scan enable signal SE, an input clock signal CLK and a second signal NET2. The second circuit 305 generates an internal clock signal CLKD by performing a NOR operation on a first signal NET1 and an inversion clock signal CLKB which is inverted from the input clock signal CLK, and generates the second signal NET2 based on the internal clock signal CLKD, the clock enable signal EN and the scan enable signal SE. The output circuit 505 generates the output clock signal ECK based on the second signal NET2. The output circuit 505 includes a buffer BF, and does not include the latch circuit in the output circuit 501 in FIG. 6. Even though FIG. 20 illustrates an inverter as the buffer BF, the buffer BF is not limited to an inverter and may have various configurations.

Figure 21A:
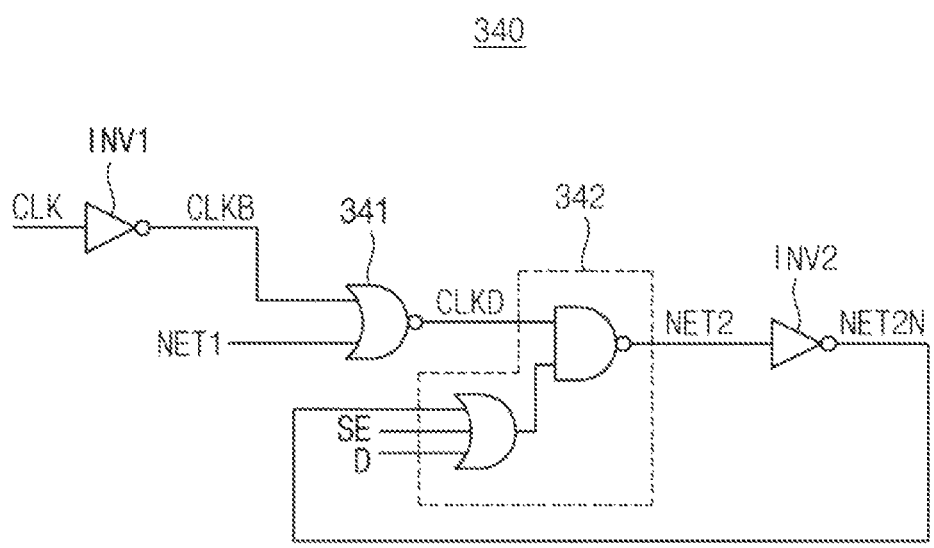
FIG. 21A is a block diagram illustrating an example embodiment of a second circuit included in the sequential circuit of FIG. 20
Figure 21B:
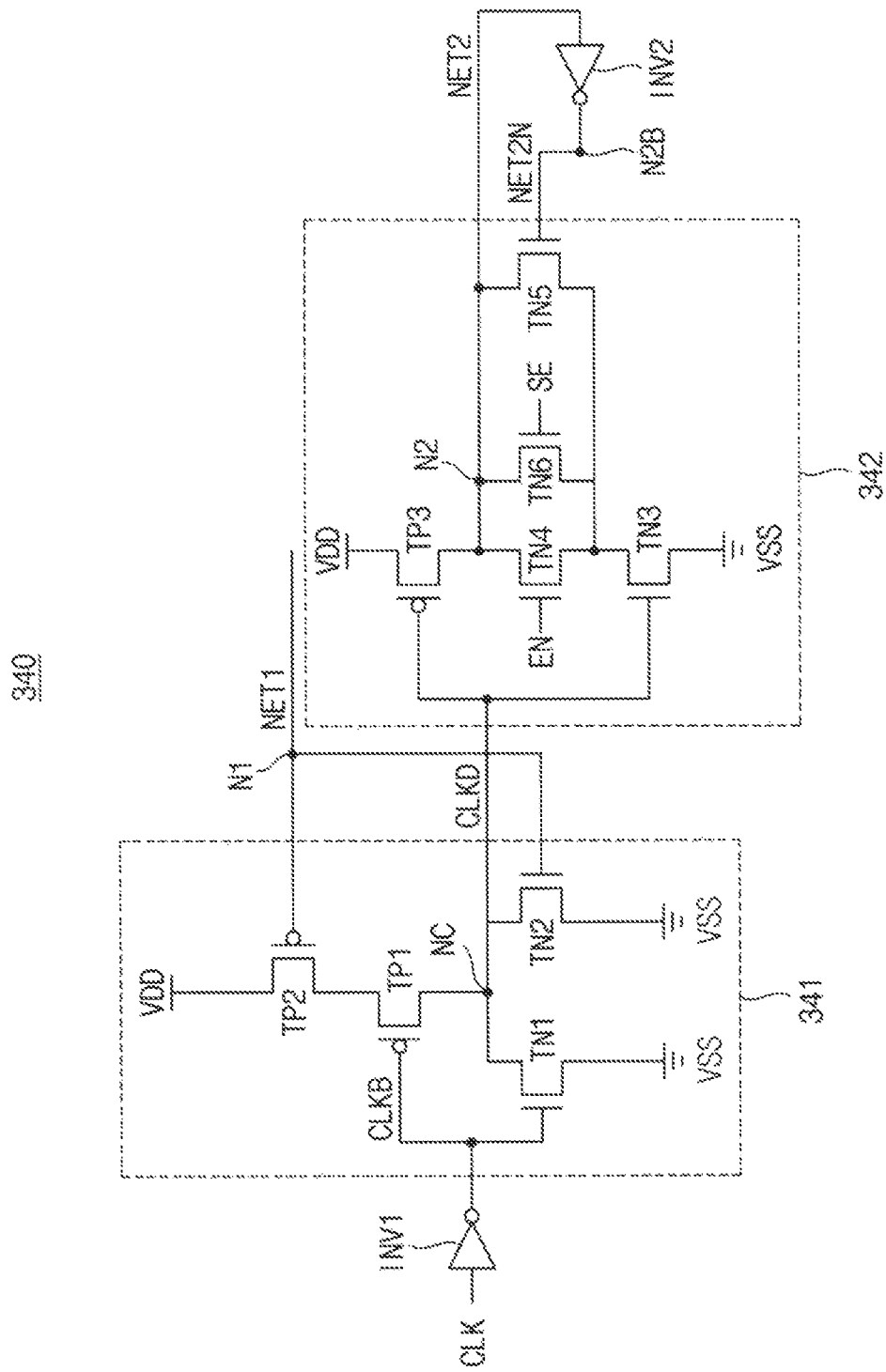
FIG. 21B is a circuit diagram illustrating an example embodiment of the second circuit of FIG. 21A.

FIG. 21A is a block diagram illustrating an example embodiment of the second circuit 305 included in the sequential circuit 1005 of FIG. 20, and FIG. 21B is a circuit diagram illustrating an example embodiment of the second circuit of FIG. 21A.

A second circuit 340 of FIGS. 21A and 21B is substantially the same as the second circuit 310 of FIGS. 3A and 3B except that the second circuit 340 adds the scan enable signal SE as an input, and the repeated descriptions are omitted. Comparing FIG. 21B with FIG. 3B, the second circuit 340 further includes an NMOS transistor TN6 receiving the scan input signal SE.

Figure 22A:
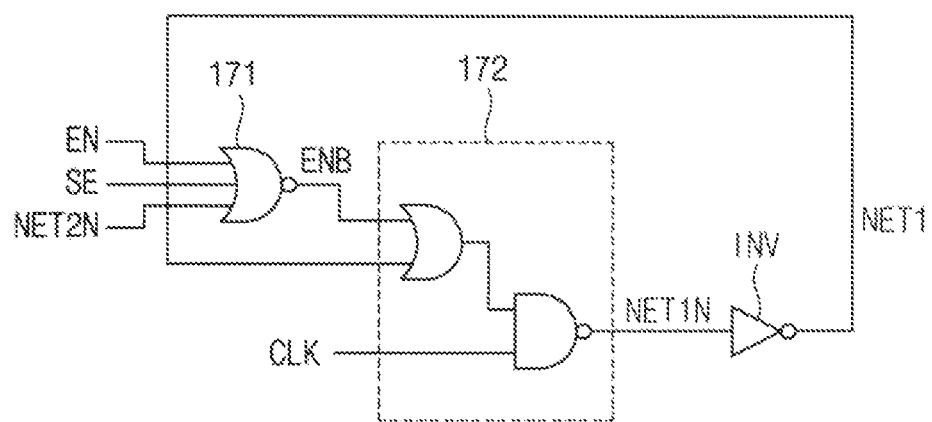
FIG. 22A is a block diagram illustrating an example embodiment of a first circuit included in the sequential circuit of FIG. 20
Figure 22B:
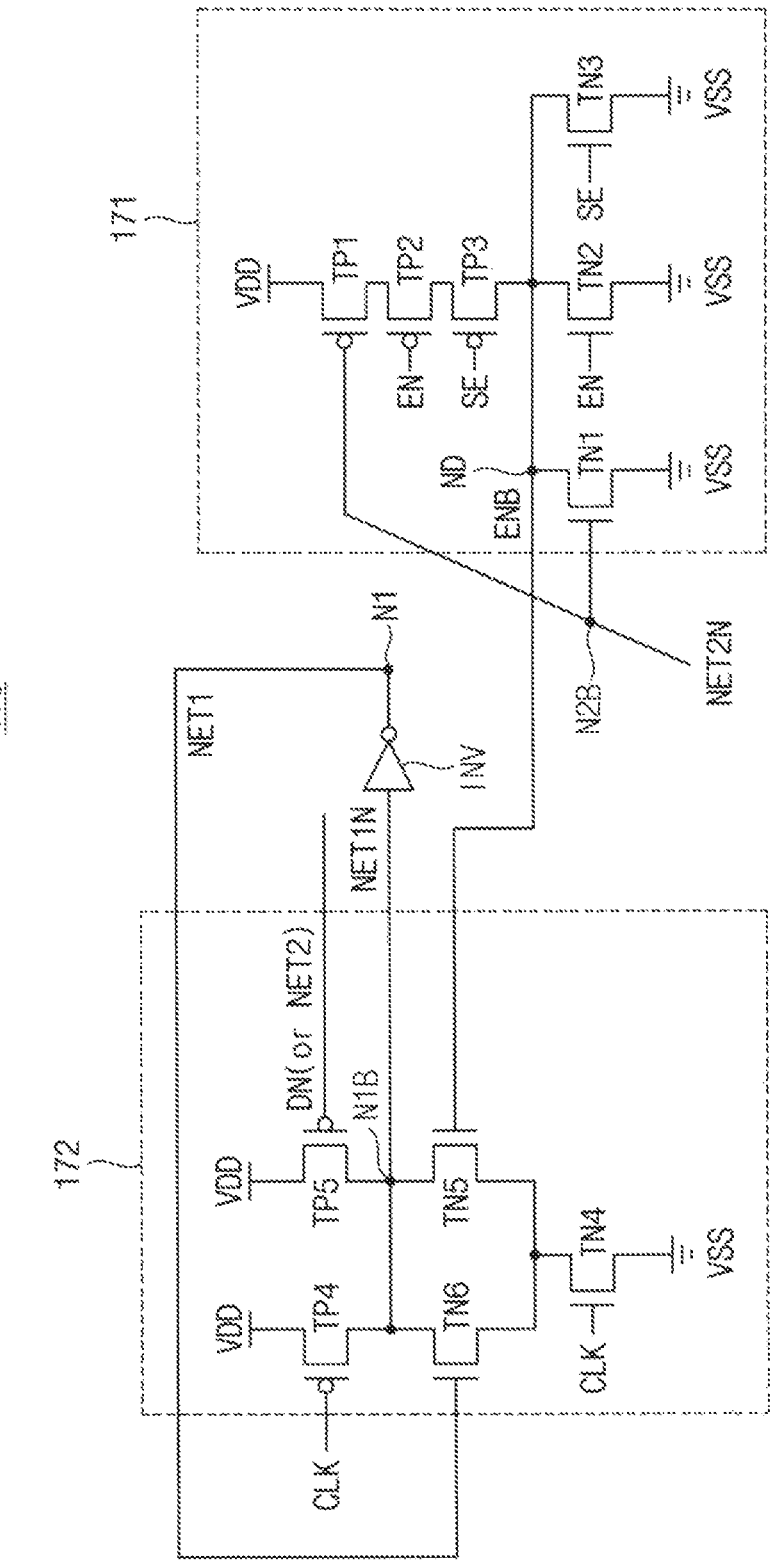
FIG. 22B is a circuit diagram illustrating an example embodiment of the first circuit of FIG. 22A.

FIG. 22A is a block diagram illustrating an example embodiment of the first circuit 105 included in the sequential circuit 1005 of FIG. 20, and FIG. 22B is a circuit diagram illustrating an example embodiment of the first circuit of FIG. 22A.

A first circuit 170 of FIGS. 22A and 22B is substantially the same as the first circuit 110 of FIGS. 4A and 4B except that the first circuit 170 adds the scan enable signal SE as an input, and the repeated descriptions are omitted. Comparing FIG. 22B with FIG. 4B, the first circuit 170 further includes transistors TP3 and TN3 receiving the scan input signal SE, the input data signal D is replaced by the clock enable signal EN, and the internal signal DN is replaced by the internal enable signal ENB.

Figure 23A:
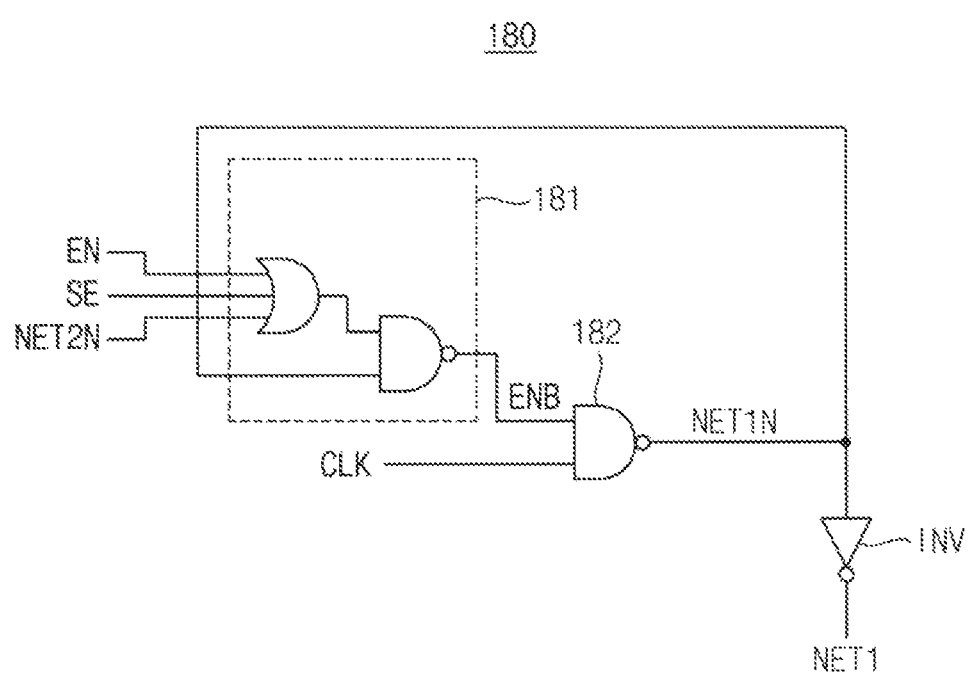
FIG. 23A is a block diagram illustrating an example embodiment of a first circuit included in the sequential circuit of FIG. 20
Figure 23B:
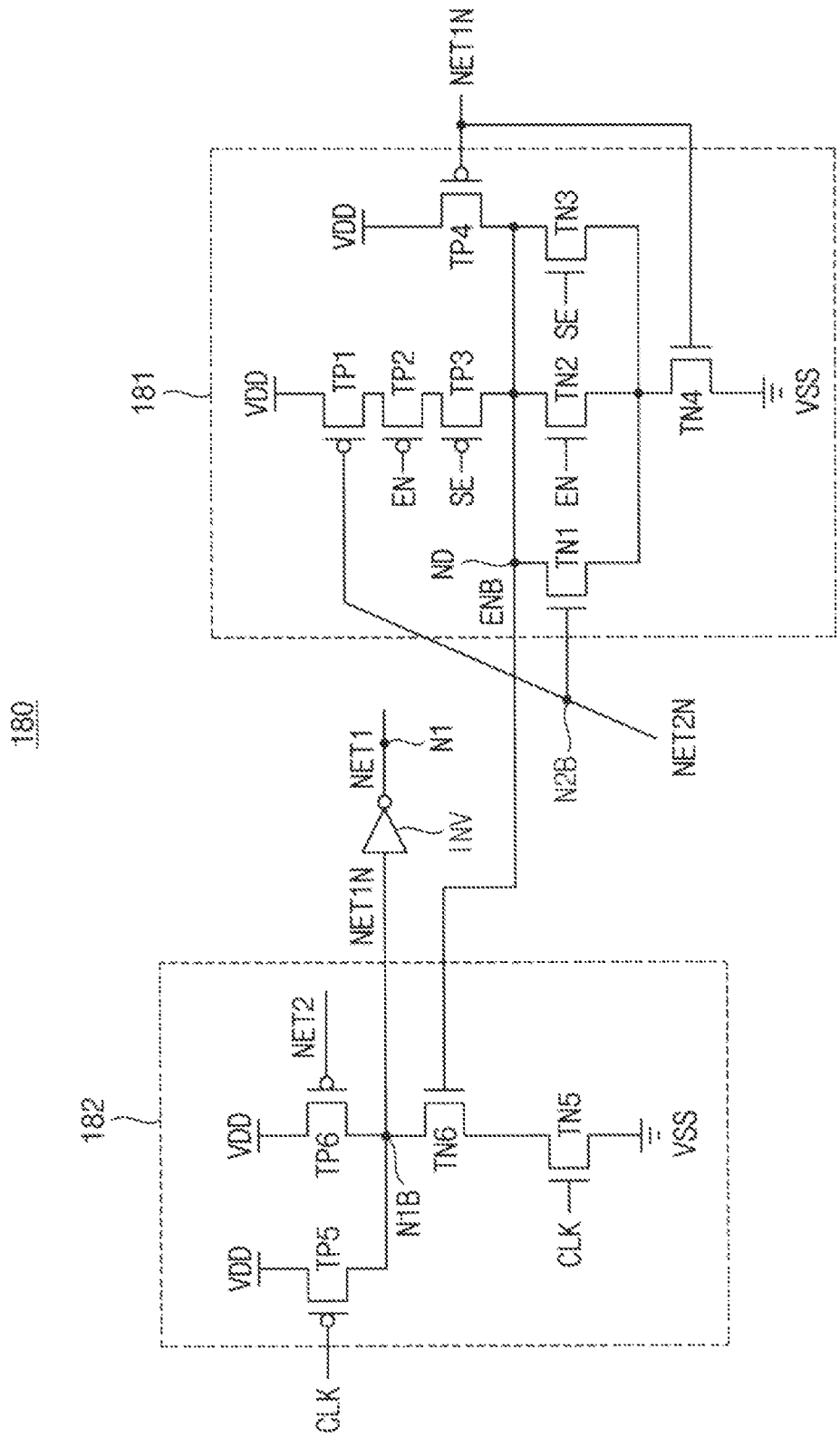
FIG. 23B is a circuit diagram illustrating an example embodiment of the first circuit of FIG. 23A.

FIG. 23A is a block diagram illustrating an example embodiment of the first circuit 105 included in the sequential circuit 1005 of FIG. 20, and FIG. 23B is a circuit diagram illustrating an example embodiment of the first circuit of FIG. 23A.

A first circuit 180 of FIGS. 23A and 23B is substantially the same as the first circuit 120 of FIGS. 10A and 10B except that the first circuit 180 adds the scan enable signal SE as an input, and the repeated descriptions are omitted. Comparing FIG. 23B with FIG. 10B, the first circuit 180 further includes transistors TP3 and TN3 receiving the scan input signal SE, the input data signal D is replaced by the clock enable signal EN, and the internal signal DN is replaced by the internal enable signal ENB.

Figure 24A:
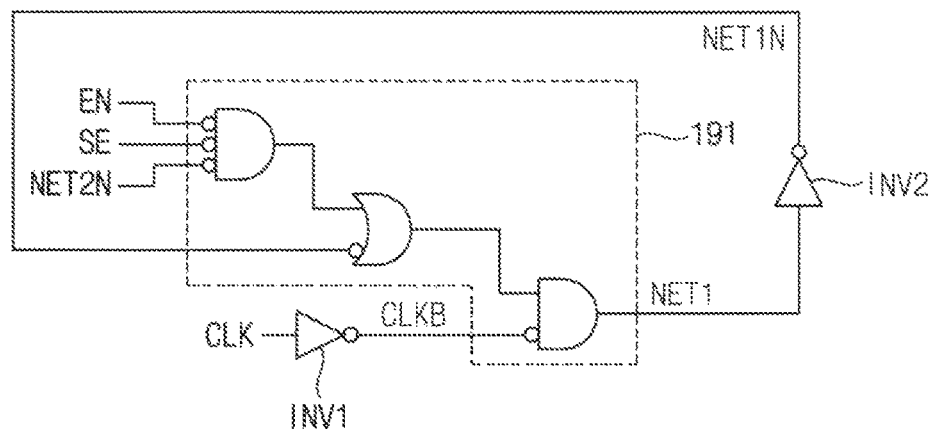
FIG. 24A is a block diagram illustrating an example embodiment of a first circuit included in the sequential circuit of FIG. 20
Figure 24B:
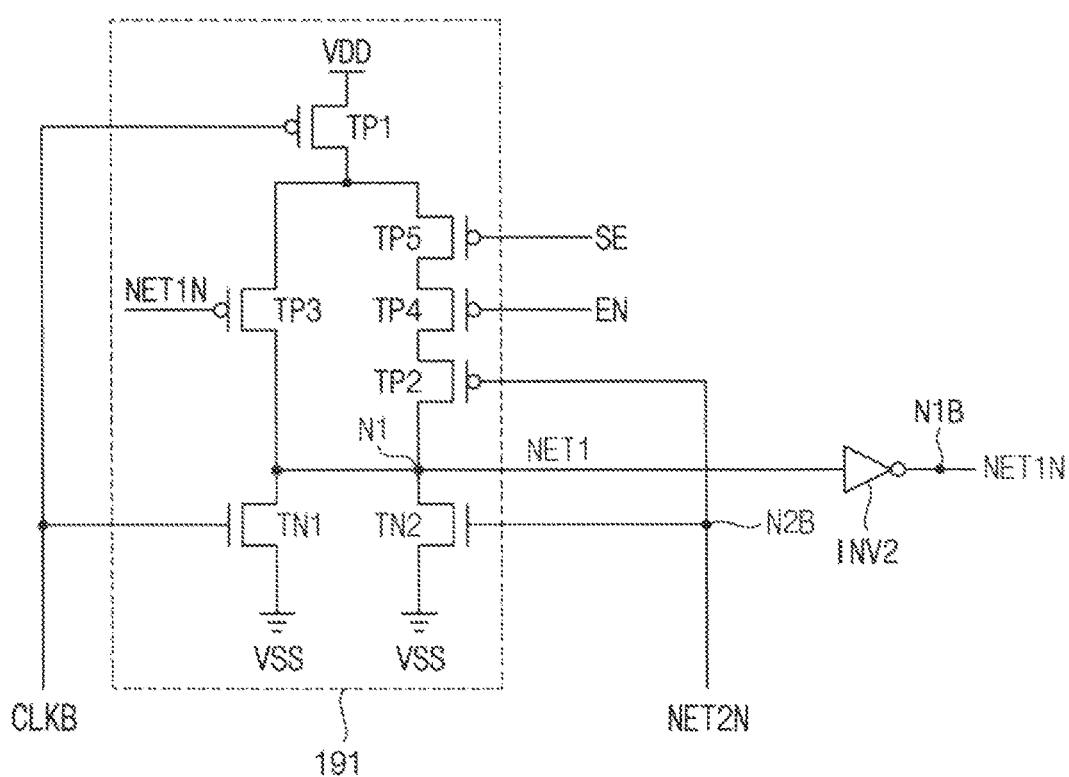
FIG. 24B is a circuit diagram illustrating an example embodiment of the first circuit of FIG. 24A.

FIG. 24A is a block diagram illustrating an example embodiment of the first circuit 105 included in the sequential circuit 1005 of FIG. 20, and FIG. 24B is a circuit diagram illustrating an example embodiment of the first circuit of FIG. 24A.

A first circuit 190 of FIGS. 24A and 24B is substantially the same as the first circuit 130 of FIGS. 11A and 11B except that the first circuit 190 adds the scan enable signal SE as an input, and the repeated descriptions are omitted. Comparing FIG. 24B with FIG. 11B, the first circuit 190 further includes a transistor TP5 receiving the scan input signal SE, and the input data signal D is replaced by the clock enable signal EN.

FIG. 25 is a block diagram illustrating a sequential circuit according to example embodiments.

A sequential circuit 1006 of FIG. 25 is substantially the same as the sequential circuit 1004 of FIG. 15 except that the sequential circuit 1006 adds a reset signal R as an input, and the repeated descriptions are omitted. A first circuit 106 and a second circuit 306 in the sequential circuit 1006 may reset values of inner nodes in response to the reset signal R.

Figure 26A:
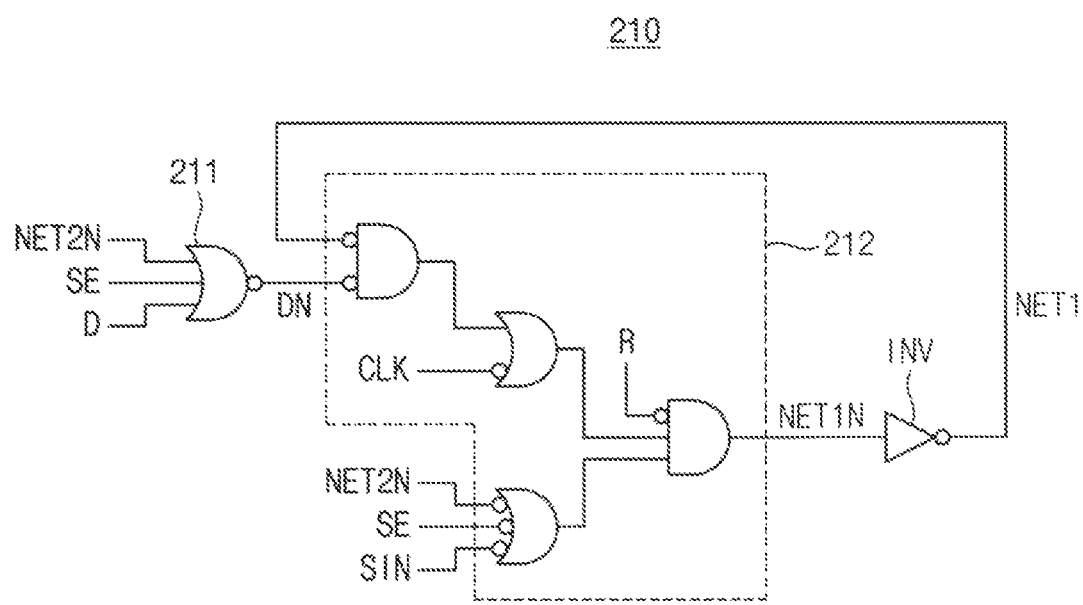
FIG. 26A is a block diagram illustrating an example embodiment of a first circuit included in the sequential circuit of FIG. 25
Figure 26B:
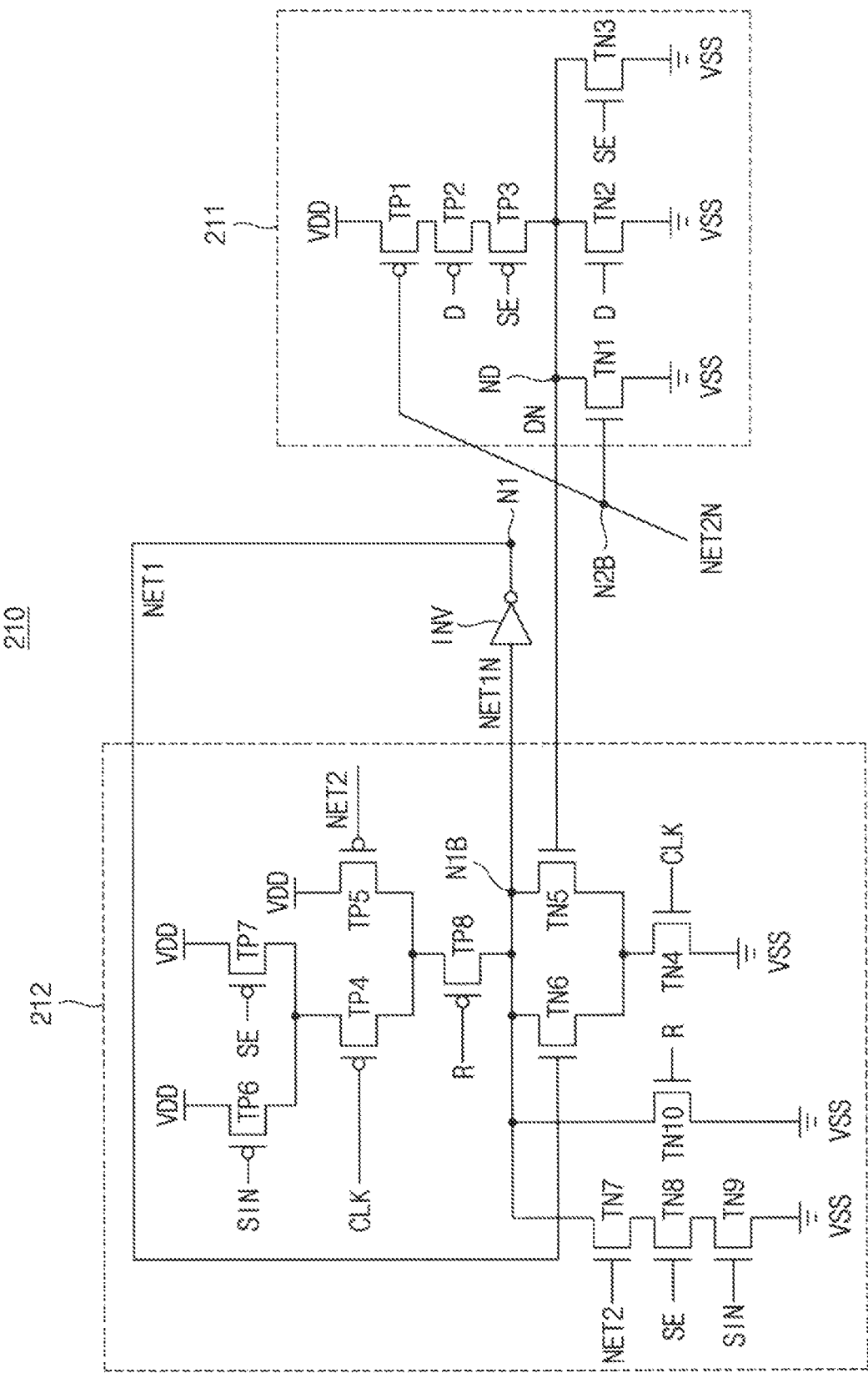
FIG. 26B is a circuit diagram illustrating an example embodiment of the first circuit of FIG. 26A.

FIG. 26A is a block diagram illustrating an example embodiment of the first circuit 106 included in the sequential circuit 1006 of FIG. 25, and FIG. 26B is a circuit diagram illustrating an example embodiment of the first circuit of FIG. 26A.

A first circuit 210 of FIGS. 26A and 26B is substantially the same as the first circuit 140 of FIGS. 17A and 17B except that the first circuit 210 adds the reset signal R as an input, and the repeated descriptions are omitted. Comparing FIG. 26B with FIG. 17B, the first circuit 210 further includes transistors TP8 and TN10 receiving the reset signal R.

Figure 27A:
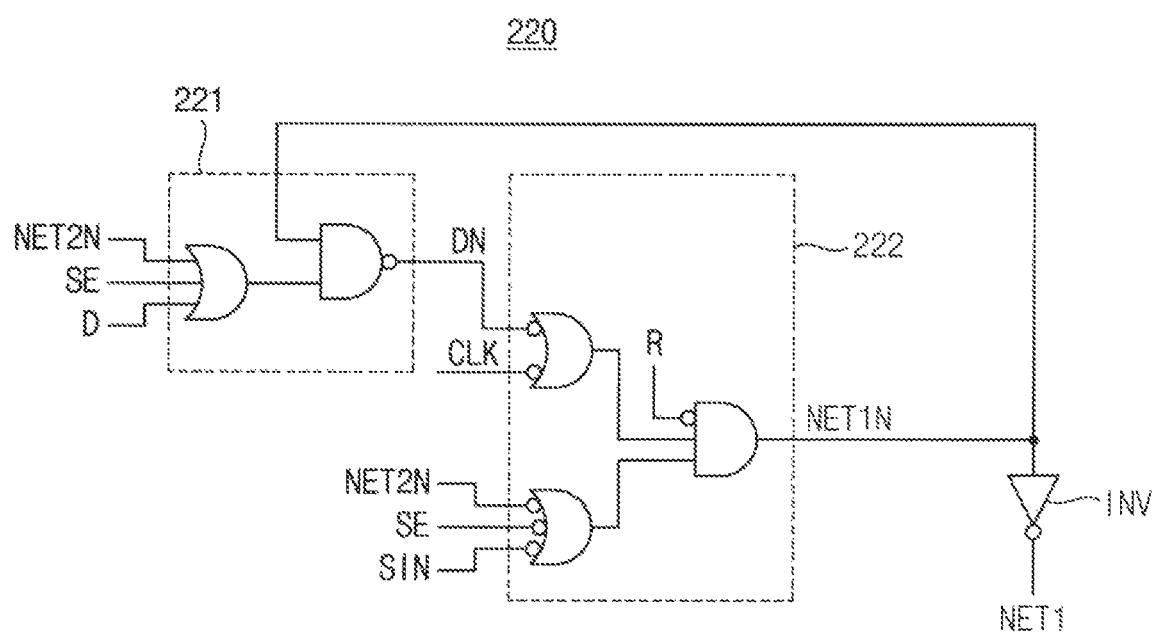
FIG. 27A is a block diagram illustrating an example embodiment of a first circuit included in the sequential circuit of FIG. 25
Figure 27B:
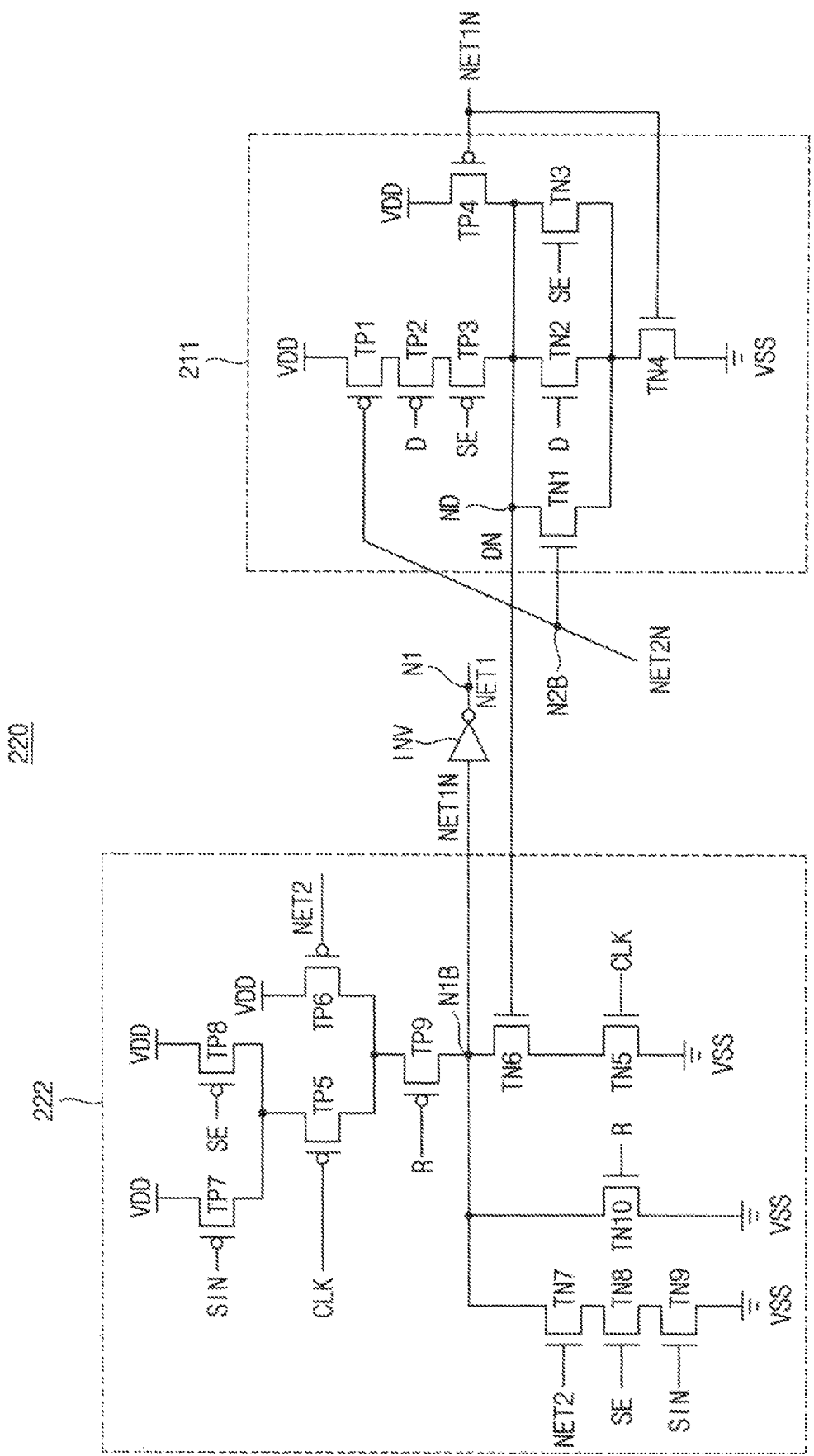
FIG. 27B is a circuit diagram illustrating an example embodiment of the first circuit of FIG. 27A.

FIG. 27A is a block diagram illustrating an example embodiment of the first circuit 106 included in the sequential circuit 1006 of FIG. 25, and FIG. 27B is a circuit diagram illustrating an example embodiment of the first circuit of FIG. 27A.

A first circuit 220 of FIGS. 27A and 27B is substantially the same as the first circuit 150 of FIGS. 18A and 18B except that the first circuit 220 adds the reset signal R as an input, and the repeated descriptions are omitted. Comparing FIG. 27B with FIG. 18B, the first circuit 220 further includes transistors TP9 and TN10 receiving the reset signal R.

Figure 28A:
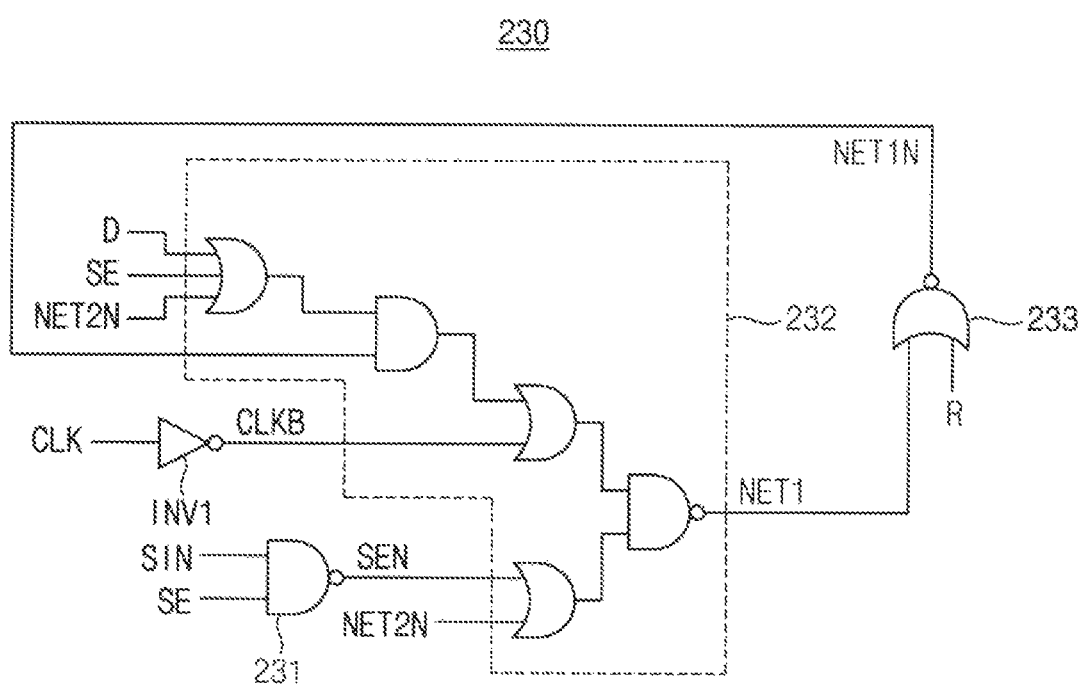
FIG. 28A is a block diagram illustrating an example embodiment of a first circuit included in the sequential circuit of FIG. 25
Figure 28B:
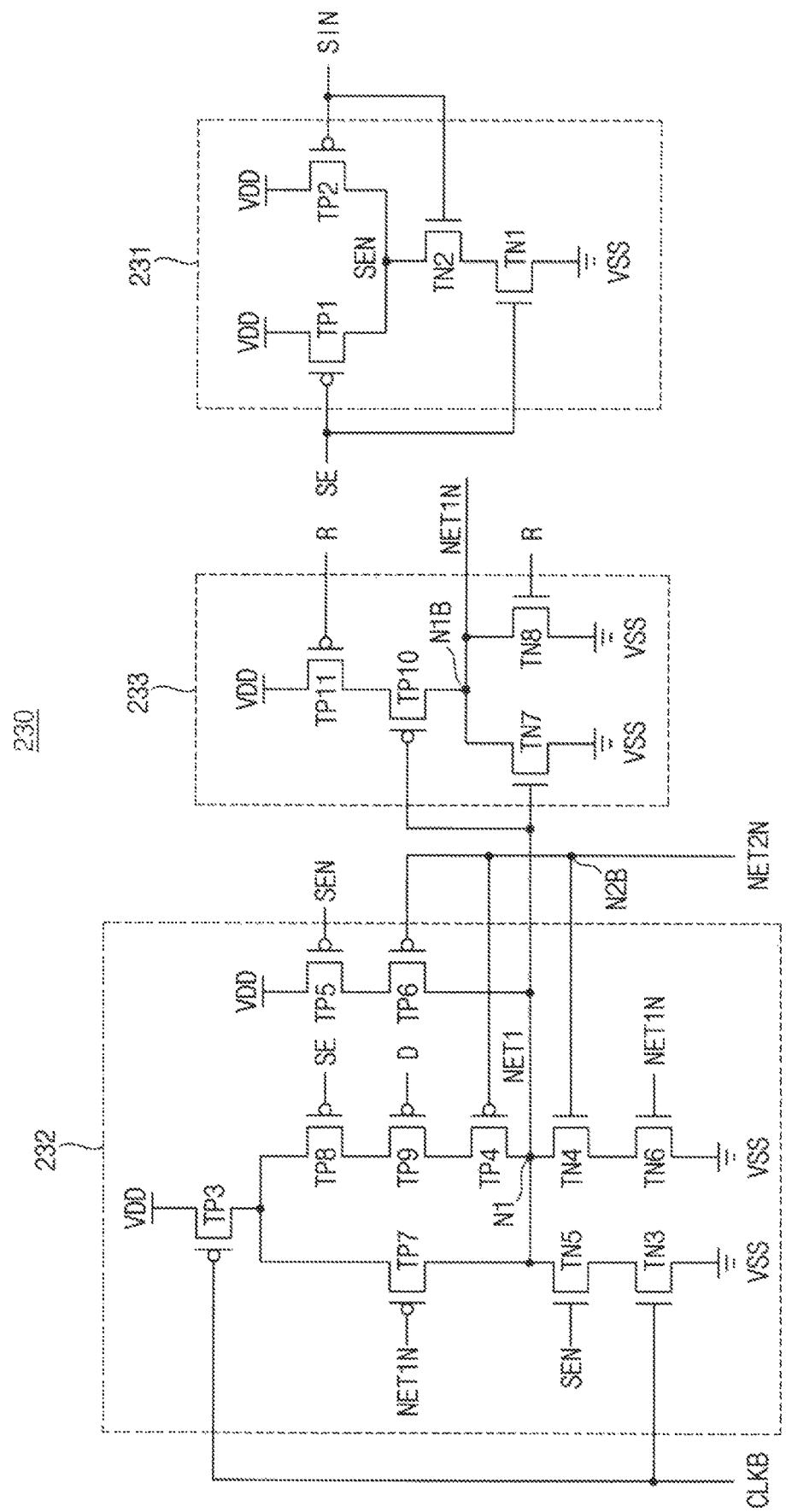
FIG. 28B is a circuit diagram illustrating an example embodiment of the first circuit of FIG. 28A.

FIG. 28A is a block diagram illustrating an example embodiment of the first circuit 106 included in the sequential circuit 1006 of FIG. 25, and FIG. 28B is a circuit diagram illustrating an example embodiment of the first circuit of FIG. 28A.

The first circuit 230 of FIGS. 28A and 28B is substantially the same as the first circuit 160 of FIGS. 19A and 19B except that the first circuit 230 adds the reset signal R as an input, and the repeated descriptions are omitted. Comparing FIG. 28B with FIG. 19B, the inverter INV2 in FIG. 19B is replaced by a NOR gate 233 in FIG. 28B. The NOR gate 233 includes transistors TP10, TP11, TN7 and TN8 configured to generate a first inversion signal NETIN by performing a NOR operation on the reset signal R and the first signal NET1.

Figure 29:
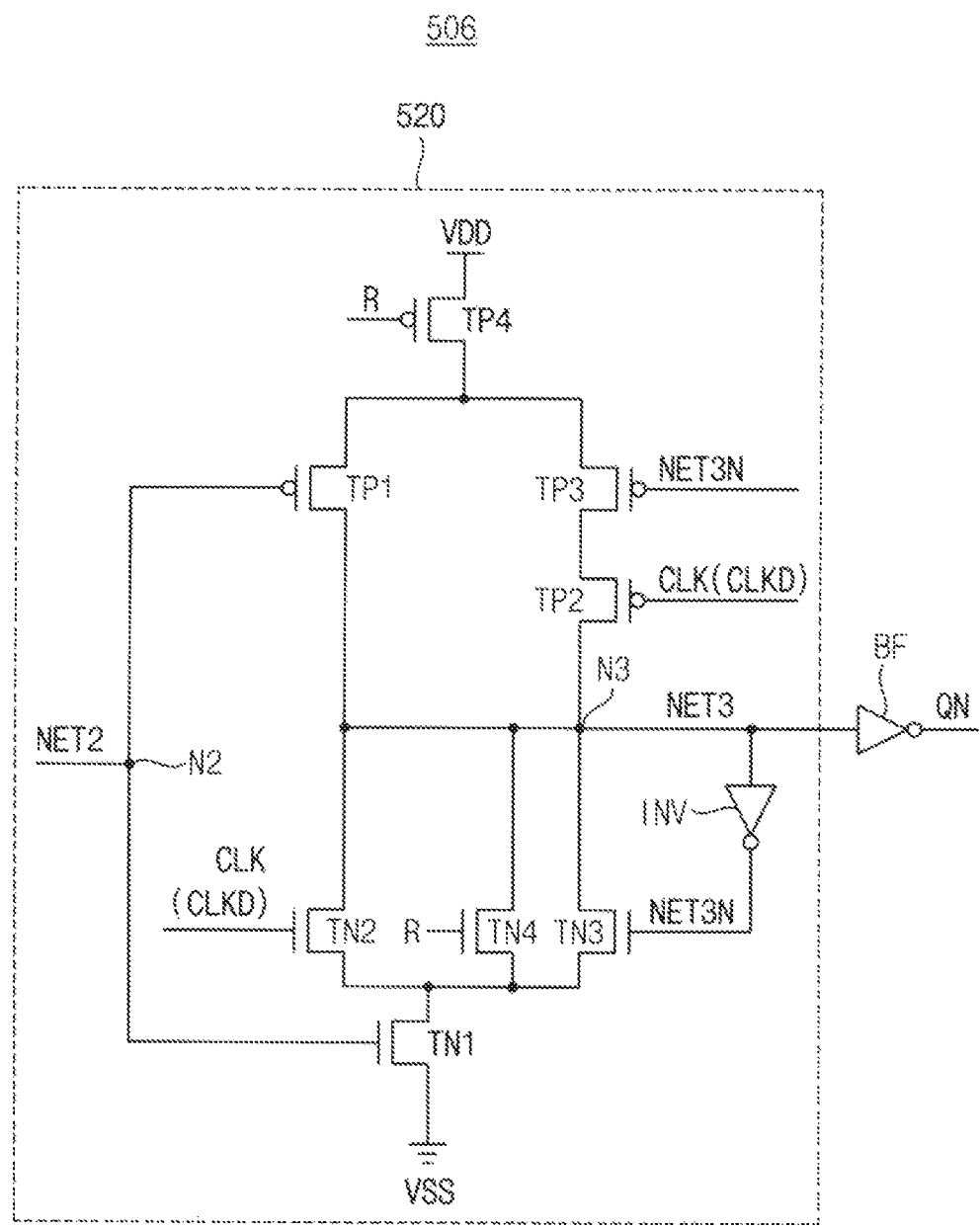
FIG. 29 is a circuit diagram illustrating an example embodiment of an output circuit included in the sequential circuit of FIG. 25.

FIG. 29 is a circuit diagram illustrating an example embodiment of the output circuit 506 included in the sequential circuit 1006 of FIG. 25.

A latch circuit 520 included in the output circuit 506 of FIG. 29 is substantially the same as the latch circuit 510 included in the output circuit 501 of FIG. 7 except that the latch circuit 520 adds the reset signal R as an input, and the repeated descriptions are omitted. Comparing FIG. 29 with FIG. 7, the latch circuit 520 in FIG. 29 further includes transistors TP4 and TN4 receiving the reset signal R.

The sequential circuit having a reset function has been described with referent to FIGS. 25 and 29, but example embodiments are not limited thereto. Those skilled in the art will be easily understood that disclosed example embodiments associated with the reset function may be modified to example embodiments associated with a set function through signal inversion, exchange of transistor type between an N-type and a P-type, etc.

Figure 30:
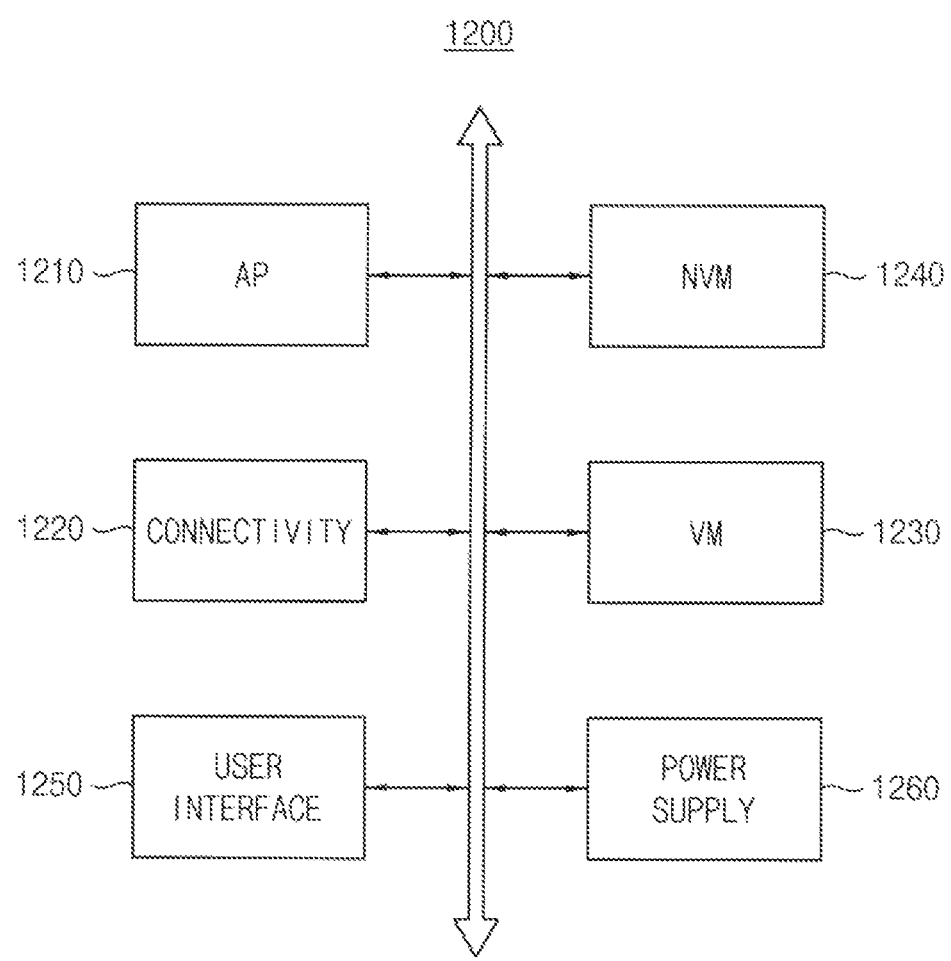
FIG. 30 is a block diagram illustrating a system according to example embodiments.

FIG. 30 is a block diagram illustrating a system according to example embodiments.

Referring to FIG. 30, a system 1200 includes an application processor 1210, a connectivity circuit 1220, a volatile memory device (VM) 1230, a nonvolatile memory device (NVM) 1240, a user interface 1250, and a power supply 1260.

The application processor 1210 may execute computer instructions stored in computer-readable media (e.g., memory devices), including applications such as a web browser, a game application, a video player, etc. The connectivity circuit 1220 may perform wired or wireless communication with an external device. The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

The system 1200 may include one or more sequential circuits as described with referent to FIGS. 1 through 29. In some example embodiments, the system 1200 may include a scan chain using the sequential circuits according to example embodiments.

As described above, the sequential circuit according to example embodiments may have the increased negative setup time reflecting a transition of the input signal after a transition of the input clock signal, through mutual controls between the first circuit and the second circuit, and thus, the operation speed of the sequential circuit and the integrated circuit including the sequential circuit may be increased. The sequential circuit according to example embodiments may include only a single stage of a gate circuit on a data transfer path in the second circuit to reduce a data output delay, and thus, the operation speed of the sequential circuit and the integrated circuit including the sequential circuit may be increased. The sequential circuit according to example embodiments may set the delay time of the scan test path longer than the delay time of the normal path, and thus, the scan test may be supported efficiently.

The present inventive concept may be applied to any devices and systems. For example, the present inventive concept may be applied to systems such as be a memory card, a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The present inventive concept may be applied to any devices and systems including a memory device requiring a refresh operation. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although some example embodiments have been described, those skilled in the art will readily appreciate that many modifications are possible in the example embodiments without materially departing from the present inventive concept.

What is claimed is:

1. A sequential circuit comprising:
a first circuit configured to generate a first signal based on an input signal, an input clock signal and a second signal;
a second circuit configured to generate an internal clock signal by performing a NOR operation on the first signal and an inversion clock signal which is inverted from the input clock signal, and configured to generate the second signal based on the internal clock signal and the input signal; and
an output circuit configured to generate an output signal based on the second signal,
wherein the first circuit comprises a first gate circuit configured to generate an internal signal by performing a NOR operation on the input signal and a second inversion signal which is inverted from the second signal.

2. The sequential circuit of claim 1, wherein, in response to the input signal transitioning before a negative setup time elapses from a time point when the input clock signal transitions from a first logic level to a second logic level, one of the first signal and the second signal transitions.

3. The sequential circuit of claim 2, wherein, when the input clock signal has the first logic level, the first signal has the first logic level, and the second signal has the second logic level, and
wherein one of the first signal and the second signal transitions depending on a logic level of the input signal at a time point when the input clock signal transitions from the first logic level to the second logic level.

4. The sequential circuit of claim 2, wherein, in response to the input signal transitioning after the negative setup time elapses from the time point when the input clock signal transitions from the first logic level to the second logic level, both of the first signal and the second signal do not transition.

5. The sequential circuit of claim 2, wherein, when the input signal transitions from the first logic level to the second logic level, the negative setup time corresponds to a first delay time from a transitioning time point of the input clock signal to a transitioning time point of the first signal, and
wherein, when the input signal transitions from the second logic level to the first logic level, the negative setup time corresponds to a second delay time from the transitioning time point of the input clock signal to a transitioning time point of the second signal.

6. The sequential circuit of claim 1, wherein the first circuit further comprises:
a second gate circuit configured to generate a first inversion signal by performing a NAND operation on the input clock signal and an OR operation result of the internal signal and the first signal; and
an inverter configured to generate the first signal by inverting the first inversion signal.

7. The sequential circuit of claim 1, wherein the sequential circuit is a flip-flop configured to receive, as the input signal, an input data signal, and configured to generate, as the output signal, an output data signal corresponding to the input data signal, and
wherein the output circuit comprises:
a latch circuit configured to latch the second signal; and
a buffer configured to generate the output data signal by buffering an output of the latch circuit.

8. The sequential circuit of claim 1, wherein the sequential circuit is a clock gating circuit configured to receive, as the input signal, a clock enable signal, and configured to generate, as the output signal, an output clock signal that toggles in response to an activation of the clock enable signal, and
wherein the output circuit comprises a buffer configured to generate the output clock signal by buffering the second signal.

9. The sequential circuit of claim 1, further comprising a multiplexer configured to select one of an input data signal and a scan input signal in response to a scan enable signal to output a selected signal as the input signal.

10. A sequential circuit comprising:
a first circuit configured to generate a first signal based on an input signal, an input clock signal and a second signal;
a second circuit configured to generate an internal clock signal by performing a NOR operation on the first signal and an inversion clock signal which is inverted from the input clock signal, and configured to generate the second signal based on the internal clock signal and the input signal; and
an output circuit configured to generate an output signal based on the second signal,
wherein the second circuit comprises:
a first gate circuit configured to generate the internal clock signal by performing the NOR operation on the first signal and the inversion clock signal;
a second gate circuit configured to generate the second signal by performing a NAND operation on the internal clock signal and an OR operation result of the input signal and a second inversion signal; and
an inverter configured to generate the second inversion signal by inverting the second signal.

* * * * *